(12) United States Patent
Li et al.

(10) Patent No.: US 11,963,397 B2
(45) Date of Patent: Apr. 16, 2024

(54) DISPLAY PANEL, METHOD FOR MANUFACTURING THE SAME AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventors: Meng Li, Beijing (CN); Yongqian Li, Beijing (CN); Jingquan Wang, Beijing (CN); Chen Xu, Beijing (CN); Dacheng Zhang, Beijing (CN); Zhidong Yuan, Beijing (CN); Can Yuan, Beijing (CN); Xuehuan Feng, Beijing (CN)

(73) Assignees: HEFEI BOE JOINT TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 468 days.

(21) Appl. No.: 17/280,725

(22) PCT Filed: May 15, 2020

(86) PCT No.: PCT/CN2020/090542
§ 371 (c)(1),
(2) Date: Mar. 26, 2021

(87) PCT Pub. No.: WO2021/227025
PCT Pub. Date: Nov. 18, 2021

(65) Prior Publication Data
US 2022/0123056 A1     Apr. 21, 2022

(51) Int. Cl.
*H10K 59/121* (2023.01)
*H10K 59/126* (2023.01)
(Continued)

(52) U.S. Cl.
CPC ....... *H10K 59/121* (2023.02); *H10K 59/1216* (2023.02); *H10K 59/126* (2023.02);
(Continued)

(58) Field of Classification Search
CPC .... H10K 59/121; H10K 59/131; H10K 59/38; H10K 59/126; H10K 59/1216; H10K 59/1201; H10K 71/00
(Continued)

(56) References Cited

U.S. PATENT DOCUMENTS 10,572,062 B2    2/2020   Kurasawa et al.
2010/0096988 A1  4/2010   Kitabayashi et al.
(Continued)

FOREIGN PATENT DOCUMENTS

CN    106502019 A    3/2017
CN    108288620 A    7/2018
(Continued)

OTHER PUBLICATIONS

Extended European Search Report for Application No. 20900682.4-1211, dated Sep. 12, 2022, 11 Pages.
(Continued)

*Primary Examiner* — Tu-Tu V Ho
(74) *Attorney, Agent, or Firm* — BROOKS KUSHMAN P.C.

(57) ABSTRACT

A display region includes a plurality of pixel driving circuitry setting regions arranged sequentially in a first direction, and each pixel driving circuitry setting region extends in a second direction intersecting the first direction. Each display circuitry includes a plurality of subpixels in one-to-one correspondence with the pixel driving circuitry setting regions, each subpixel includes a subpixel driving circuitry and a light-emitting element coupled to each other, the subpixel driving circuitry is located in a corresponding pixel
(Continued)

driving circuitry setting region, the light-emitting element is located at a side of the subpixel driving circuitry away from the substrate, a width of the light-emitting element is greater than a width of the corresponding pixel driving circuitry setting region in the first direction, and a length of the light-emitting element is smaller than a length of the corresponding pixel driving circuitry setting region in the second direction.

19 Claims, 16 Drawing Sheets

(51) Int. Cl.
  *H10K 59/131* (2023.01)
  *H10K 59/38* (2023.01)
  *H10K 71/00* (2023.01)
  *H10K 59/12* (2023.01)

(52) U.S. Cl.
  CPC .......... *H10K 59/131* (2023.02); *H10K 59/38* (2023.02); *H10K 71/00* (2023.02); *H10K 59/1201* (2023.02)

(58) Field of Classification Search
  USPC ........................................................ 257/40
  See application file for complete search history.

(56) References Cited

U.S. PATENT DOCUMENTS

| | | | |
|---|---|---|---|
| 2017/0193876 A1* | 7/2017 | Choi | G09G 3/2003 |
| 2018/0190217 A1 | 7/2018 | Jung | |
| 2019/0163005 A1 | 5/2019 | Hsu | |
| 2019/0180692 A1 | 6/2019 | Fujii et al. | |

FOREIGN PATENT DOCUMENTS

| | | |
|---|---|---|
| CN | 109716422 A | 5/2019 |
| CN | 110718575 A | 1/2020 |
| CN | 110767665 A | 2/2020 |
| CN | 111028801 A | 4/2020 |
| EP | 2378556 A1 | 10/2011 |
| EP | 3139422 A2 | 3/2017 |
| EP | 3193322 A1 | 7/2017 |

OTHER PUBLICATIONS

CN106502019A, English Abstract and U.S. Equivalent U.S. Pub. No. 2018/0190217.
CN108288620A, English Abstract and U.S. Equivalent U.S. Pub. No. 2019/0163005.
CN109716422A, English Abstract and U.S. Equivalent U.S. Pub. No. 2019/0180692.
CN110718575A, English Abstract and Machine Translation.
CN110767665A, English Abstract and Machine Translation.
CN111028801A, English Abstract and Machine Translation.

* cited by examiner

DISPLAY PANEL, METHOD FOR MANUFACTURING THE SAME AND DISPLAY DEVICE

CROSS-REFERENCE TO RELATED APPLICATION

This application is the U.S. national phase of PCT Application No. PCT/CN2020/090542 filed on May 15, 2020, which is incorporated herein by reference in its entirety.

TECHNICAL FIELD

The present disclosure relates to the field of display technology, in particular to a display panel, a method for manufacturing the display panel, and a display device.

BACKGROUND

Currently, there is such a trend in the display field as to provide high resolution, narrow bezel, low power consumption and individualized display. As one of the individualized display, transparent display focuses on transmittance and a display effect. During the design, a pixel of a transparent display product includes a transparent region, and a display region, i.e., a pixel region. The manufacture of a complete pixel region includes processes for forming an array (i.e., forming metal lines, transistors and storage capacitors), a color filter, and a light-emitting functional layer.

SUMMARY

In one aspect, the present disclosure provides in some embodiments a display panel, including a substrate, and a plurality of display circuitries arranged on the substrate. Each display circuitry includes a display region and a transparent region, the display region includes a plurality of pixel driving circuitry setting regions arranged sequentially in a first direction, and each pixel driving circuitry setting region extends in a second direction intersecting the first direction. Each display circuitry includes a plurality of subpixels in one-to-one correspondence with the pixel driving circuitry setting regions, each subpixel includes a subpixel driving circuitry and a light-emitting element coupled to each other, the subpixel driving circuitry is located in a corresponding pixel driving circuitry setting region, the light-emitting element is located at a side of the subpixel driving circuitry away from the substrate, a width of the light-emitting element is greater than a width of the corresponding pixel driving circuitry setting region in the first direction, and a length of the light-emitting element is smaller than a length of the corresponding pixel driving circuitry setting region in the second direction.

In a possible embodiment of the present disclosure, the light-emitting element includes an anode, a first light-emitting functional layer and a color filter pattern laminated one on another in a direction away from the substrate, and the anode is coupled to a corresponding subpixel driving circuitry. A width of the anode is greater than the width of the corresponding pixel driving circuitry setting region in the first direction, a length of the anode is smaller than the length of the corresponding pixel driving circuitry setting region in the second direction, a width of the color filter pattern is greater than the width of the corresponding pixel driving circuitry setting region in the first direction, and a length of the color filter pattern is smaller than the length of the corresponding pixel driving circuitry setting region in the second direction.

In a possible embodiment of the present disclosure, the light-emitting element includes an anode and a second light-emitting functional layer laminated one on another sequentially in a direction away from the substrate, and the anode is coupled to a corresponding subpixel driving circuitry. A width of the anode is greater than the width of the corresponding pixel driving circuitry setting region in the first direction, a length of the anode is smaller than the length of the corresponding pixel driving circuitry setting region in the second direction, a width of the second light-emitting functional layer is greater than the width of the corresponding pixel driving circuitry setting region in the first direction, and a length of the second light-emitting functional layer is smaller than the length of the corresponding pixel driving circuitry setting region in the second direction.

In a possible embodiment of the present disclosure, light-emitting elements of the plurality of subpixels in each display circuitry are arranged in an array form, an orthogonal projection of the light-emitting element of each subpixel onto the substrate overlaps orthogonal projections of at least two adjacent pixel driving circuitry setting regions in the display region where the subpixel is located onto the substrate, and the at least two adjacent pixel driving circuitry setting regions include a pixel driving circuitry setting region corresponding to the subpixel.

In a possible embodiment of the present disclosure, the display region includes a first pixel driving circuitry setting region, a second pixel driving circuitry setting region, a third pixel driving circuitry setting region and a fourth pixel driving circuitry setting region arranged sequentially in the first direction, each display circuitry includes a first subpixel, a second subpixel, a third subpixel and a fourth subpixel, the first subpixel includes a first light-emitting element, the second subpixel includes a second light-emitting element, the third subpixel includes a third light-emitting element, and the fourth subpixel includes a fourth light-emitting element. The first light-emitting element and the second light-emitting element are arranged in the second direction, an orthogonal projection of the first light-emitting element onto the substrate overlaps an orthogonal projection of the first pixel driving circuitry setting region onto the substrate and an orthogonal projection of the second pixel driving circuitry setting region onto the substrate, and an orthogonal projection of the second light-emitting element onto the substrate overlaps the orthogonal projection of the first pixel driving circuitry setting region onto the substrate and the orthogonal projection of the second pixel driving circuitry setting region onto the substrate. The third light-emitting element and the fourth light-emitting element are arranged in the second direction, an orthogonal projection of the third light-emitting element onto the substrate overlaps an orthogonal projection of the third pixel driving circuitry setting region onto the substrate and an orthogonal projection of the fourth pixel driving circuitry setting region onto the substrate, and an orthogonal projection of the fourth light-emitting element onto the substrate overlaps the orthogonal projection of the third pixel driving circuitry setting region onto the substrate and the orthogonal projection of the fourth pixel driving circuitry setting region onto the substrate.

In a possible embodiment of the present disclosure, the first subpixel further includes a first subpixel driving circuitry, the first subpixel driving circuitry includes a first storage capacitor, the first light-emitting element includes a first anode, and an orthogonal projection of the first anode onto the substrate overlaps an orthogonal projection of a second electrode plate of the first storage capacitor onto the substrate to form an overlapping region where the first anode is coupled to the second electrode plate of the first storage capacitor through a first connection hole. The second subpixel further includes a second subpixel driving circuitry, the second subpixel driving circuitry includes a second storage capacitor, the second light-emitting element includes a second anode, and an orthogonal projection of the second anode onto the substrate overlaps an orthogonal projection of a second electrode plate of the second storage capacitor onto the substrate to form an overlapping region where the second anode is coupled to the second electrode plate of the second storage capacitor through a second connection hole. The third subpixel further includes a third subpixel driving circuitry, the third subpixel driving circuitry includes a third storage capacitor, the third light-emitting element includes a third anode, and an orthogonal projection of the third anode onto the substrate overlaps an orthogonal projection of a second electrode plate of the third storage capacitor onto the substrate to form an overlapping region where the third anode is coupled to the second electrode plate of the third storage capacitor through a third connection hole. The fourth subpixel further includes a fourth subpixel driving circuitry, the fourth subpixel driving circuitry includes a fourth storage capacitor, the fourth light-emitting element includes a fourth anode, and an orthogonal projection of the fourth anode onto the substrate overlaps an orthogonal projection of a second electrode plate of the fourth storage capacitor onto the substrate to form an overlapping region where the fourth anode is coupled to the second electrode plate of the fourth storage capacitor through a fourth connection hole. The first connection hole and the fourth connection hole are arranged in the first direction, and the second connection hole and the third connection hole are arranged in the first direction.

In a possible embodiment of the present disclosure, the first subpixel includes a blue subpixel, the second subpixel includes a white subpixel, the third subpixel includes a green subpixel and the fourth subpixel includes a red subpixel.

In a possible embodiment of the present disclosure, light-emitting elements of the plurality of subpixels in each display circuitry are arranged sequentially in the second direction, and an orthogonal projection of the light-emitting element of each subpixel onto the substrate overlaps orthogonal projections of the pixel driving circuitry setting regions in the display region where the subpixel is located onto the substrate.

In a possible embodiment of the present disclosure, the display region includes a fifth pixel driving circuitry setting region, a sixth pixel driving circuitry setting region and a seventh pixel driving circuitry setting region arranged sequentially in the first direction, each display circuitry includes a fifth subpixel, a sixth subpixel and a seventh subpixel, the fifth subpixel includes a fifth light-emitting element, the sixth subpixel includes a sixth light-emitting element, the seventh subpixel includes a seventh light-emitting element, and the fifth light-emitting element, the sixth light-emitting element and the seventh light-emitting element are arranged sequentially in the second direction. An orthogonal projection of the fifth light-emitting element onto the substrate overlaps an orthogonal projection of the fifth pixel driving circuitry setting region onto the substrate, an orthogonal projection of the sixth pixel driving circuitry setting region onto the substrate, and an orthogonal projection of the seventh pixel driving circuitry setting region onto the substrate. An orthogonal projection of the sixth light-emitting element onto the substrate overlaps the orthogonal projection of the fifth pixel driving circuitry setting region onto the substrate, the orthogonal projection of the sixth pixel driving circuitry setting region onto the substrate, and the orthogonal projection of the seventh pixel driving circuitry setting region onto the substrate. An orthogonal projection of the seventh light-emitting element onto the substrate overlaps the orthogonal projection of the fifth pixel driving circuitry setting region onto the substrate, the orthogonal projection of the sixth pixel driving circuitry setting region onto the substrate, and the orthogonal projection of the seventh pixel driving circuitry setting region onto the substrate.

In a possible embodiment of the present disclosure, the fifth subpixel further includes a fifth subpixel driving circuitry, the fifth subpixel driving circuitry includes a fifth storage capacitor, the fifth light-emitting element includes a fifth anode, and an orthogonal projection of the fifth anode onto the substrate overlaps an orthogonal projection of a second electrode plate of the fifth storage capacitor onto the substrate to form an overlapping region where the fifth anode is coupled to the second electrode plate of the fifth storage capacitor through a fifth connection hole. The sixth subpixel further includes a sixth subpixel driving circuitry, the sixth subpixel driving circuitry includes a sixth storage capacitor, the sixth light-emitting element includes a sixth anode, and an orthogonal projection of the sixth anode onto the substrate overlaps an orthogonal projection of a second electrode plate of the sixth storage capacitor onto the substrate to form an overlapping region where the sixth anode is coupled to the second electrode plate of the sixth storage capacitor through a sixth connection hole. The seventh subpixel further includes a seventh subpixel driving circuitry, the seventh subpixel driving circuitry includes a seventh storage capacitor, the seventh light-emitting element includes a seventh anode, and an orthogonal projection of the seventh anode onto the substrate overlaps an orthogonal projection of a second electrode plate of the seventh storage capacitor onto the substrate to form an overlapping region where the seventh anode is coupled to the second electrode plate of the seventh storage capacitor through a seventh connection hole. The fifth connection hole, the sixth connection hole and the seventh connection hole are arranged in a staggered manner in the first direction.

In a possible embodiment of the present disclosure, the fifth subpixel includes a red subpixel, the sixth subpixel includes a green subpixel, and the seventh subpixel includes a blue subpixel.

In a possible embodiment of the present disclosure, each display circuitry includes: a first scanning line, at least a part of which extends in the first direction; a second scanning line, at least a part of which extends in the first direction; a sensing signal line, at least a part of which extends in the second direction; and a first power source signal line, at least a part of which extends in the second direction. Each subpixel further includes a data line, at least a part of which extends in the second direction. The subpixel driving circuitry includes a first transistor, a second transistor, a third transistor and a storage capacitor. A gate electrode of the first transistor is coupled to the first scanning line, a first electrode of the first transistor is coupled to the data line, and a second electrode of the first transistor is coupled to a gate electrode of the second transistor. A first electrode of the second transistor is coupled to the first power source signal line, and a second electrode of the second transistor is coupled to an anode of a light-emitting element. A gate electrode of the third transistor is coupled to the second scanning line, a first electrode of the third transistor is coupled to the sensing signal line, and a second electrode of the third transistor is coupled to the anode of the light-emitting element. A first electrode plate of the storage capacitor is coupled to the gate electrode of the second transistor, and a second electrode plate of the storage capacitor is coupled to the second electrode of the second transistor.

In a possible embodiment of the present disclosure, the first transistor, the second transistor, the storage capacitor and the third transistor are arranged sequentially in the second direction.

In a possible embodiment of the present disclosure, each subpixel further includes a light-shielding pattern arranged between the substrate and the subpixel driving circuitry and extending in the second direction, and an orthogonal projection of the subpixel driving circuitry onto the substrate is located within an orthogonal projection of the light-shielding pattern onto the substrate.

In a possible embodiment of the present disclosure, the orthogonal projection of the light-shielding pattern onto the substrate overlaps an orthogonal projection of the second electrode plate of the storage capacitor onto the substrate to form an overlapping region where the light-shielding pattern is coupled to the second electrode plate of the storage capacitor.

In a possible embodiment of the present disclosure, each display circuitry further includes a first adapter pattern, at least a part of the first adapter pattern extends in the first direction, an orthogonal projection of the first adapter pattern onto the substrate overlaps an orthogonal projection of the sensing signal line of the display circuitry onto the substrate to form an overlapping region where the first adapter pattern is coupled to the sensing signal line, the first adapter pattern is coupled to the first electrode of each third transistor in the display region where the first adapter pattern is located, and the first adapter pattern is arranged at a same layer, and made of a same material, as the light-shielding pattern.

In a possible embodiment of the present disclosure, the first power source signal line includes a first portion and a second portion laminated one on another and extending in the second direction, an orthogonal projection of the first portion onto the substrate overlaps an orthogonal projection of the second portion onto the substrate to form an overlapping region where the first portion is coupled to the second portion through a via-hole, the first portion is arranged at a same layer, and made of a same material, as the first scanning line, and the second portion is arranged at a same layer, and made of a same material, as the data line.

In a possible embodiment of the present disclosure, each display circuitry further includes a second adapter pattern, at least a part of the second adapter pattern extends in the first direction, the second adapter pattern and the first portion are formed integrally, and the second adapter pattern is coupled to the first electrode of each second transistor in the display region where the second adapter pattern is located.

In a possible embodiment of the present disclosure, each display circuitry further includes a second power source signal line, the second power source signal line includes a third portion and a fourth portion laminated one on another and extending in the second direction, an orthogonal projection of the third portion onto the substrate overlaps an orthogonal projection of the fourth portion onto the substrate to form an overlapping region where the third portion is coupled to the fourth portion through a via-hole, the third portion is arranged at a same layer, and made of a same material, as the first scanning line, and the fourth portion is arranged at a same layer, and made of a same material, as the data line. The light-emitting element further includes a cathode arranged at a side of the anode away from the substrate and coupled to the second power source signal line.

In a possible embodiment of the present disclosure, an overlapping area between the orthogonal projections of the light-emitting elements of the plurality of subpixels in one display circuitry onto the substrate and an orthogonal projection of the display region of the display circuitry onto the substrate is greater than 90% of an area of the display region.

In another aspect, the present disclosure provides in some embodiments a display device including the above-mentioned display panel.

In yet another aspect, the present disclosure provides in some embodiments a method for manufacturing a display panel, including forming a plurality of display circuitries on a substrate. Each display circuitry includes a display region and a transparent region, the display region includes a plurality of pixel driving circuitry setting regions arranged sequentially in a first direction, and each pixel driving circuitry setting region extends in a second direction intersecting the first direction. Each display circuitry includes a plurality of subpixels in one-to-one correspondence with the pixel driving circuitry setting regions, each subpixel includes a subpixel driving circuitry and a light-emitting element coupled to each other, the subpixel driving circuitry is located in a corresponding pixel driving circuitry setting region, the light-emitting element is located at a side of the subpixel driving circuitry away from the substrate, a width of the light-emitting element is greater than a width of the corresponding pixel driving circuitry setting region in the first direction, and a length of the light-emitting element is smaller than a length of the corresponding pixel driving circuitry setting region in the second direction.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

The present disclosure will be described hereinafter in conjunction with the drawings and embodiments.

Figure 1:
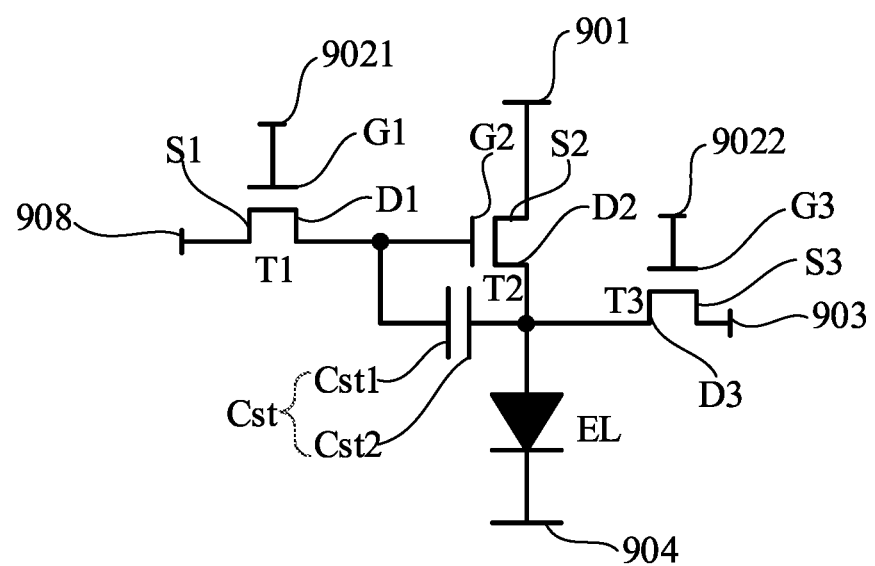
FIG. 1 is an equivalent circuit diagram of a pixel driving circuitry according to one embodiment of the present disclosure.
Figure 2:
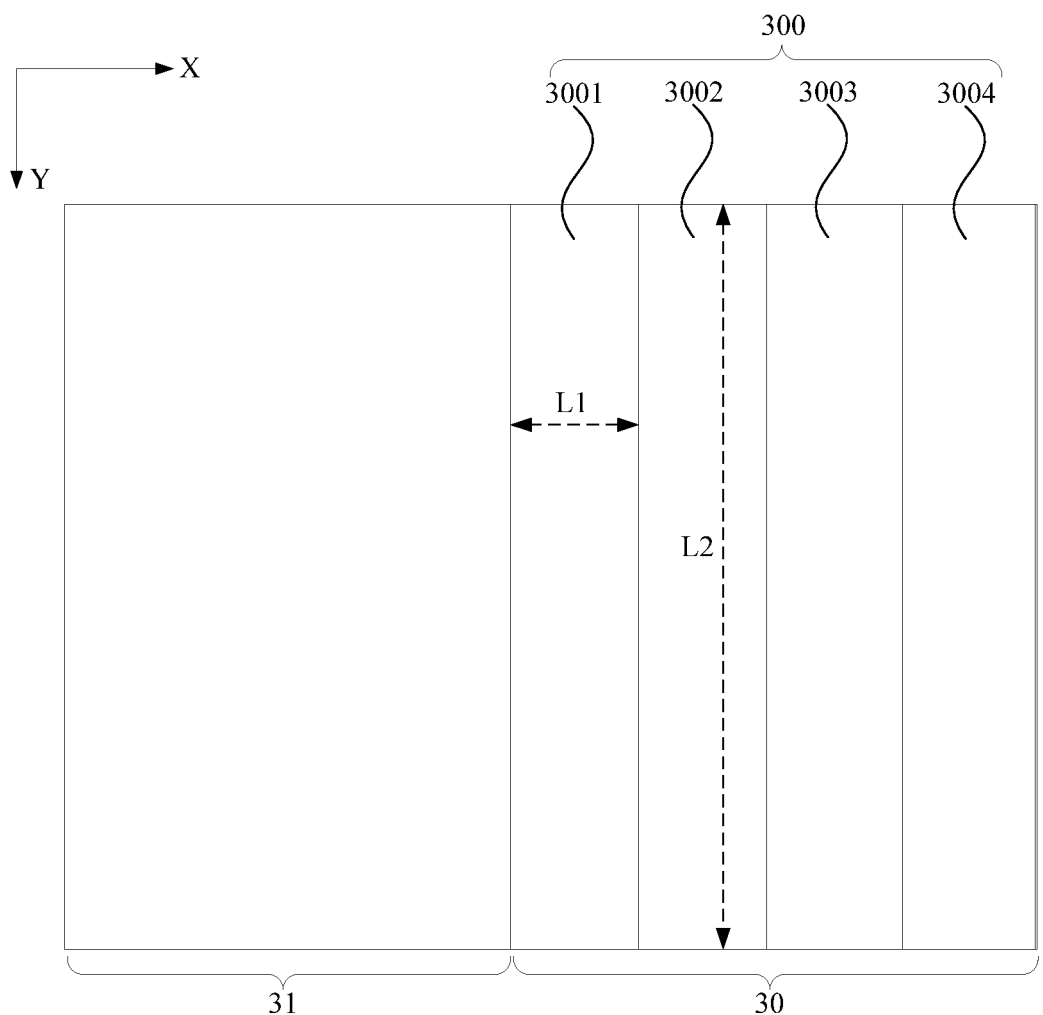
FIG. 2 is a schematic view showing a display region and a transparent region of a display circuitry according to one embodiment of the present disclosure.
Figure 3:
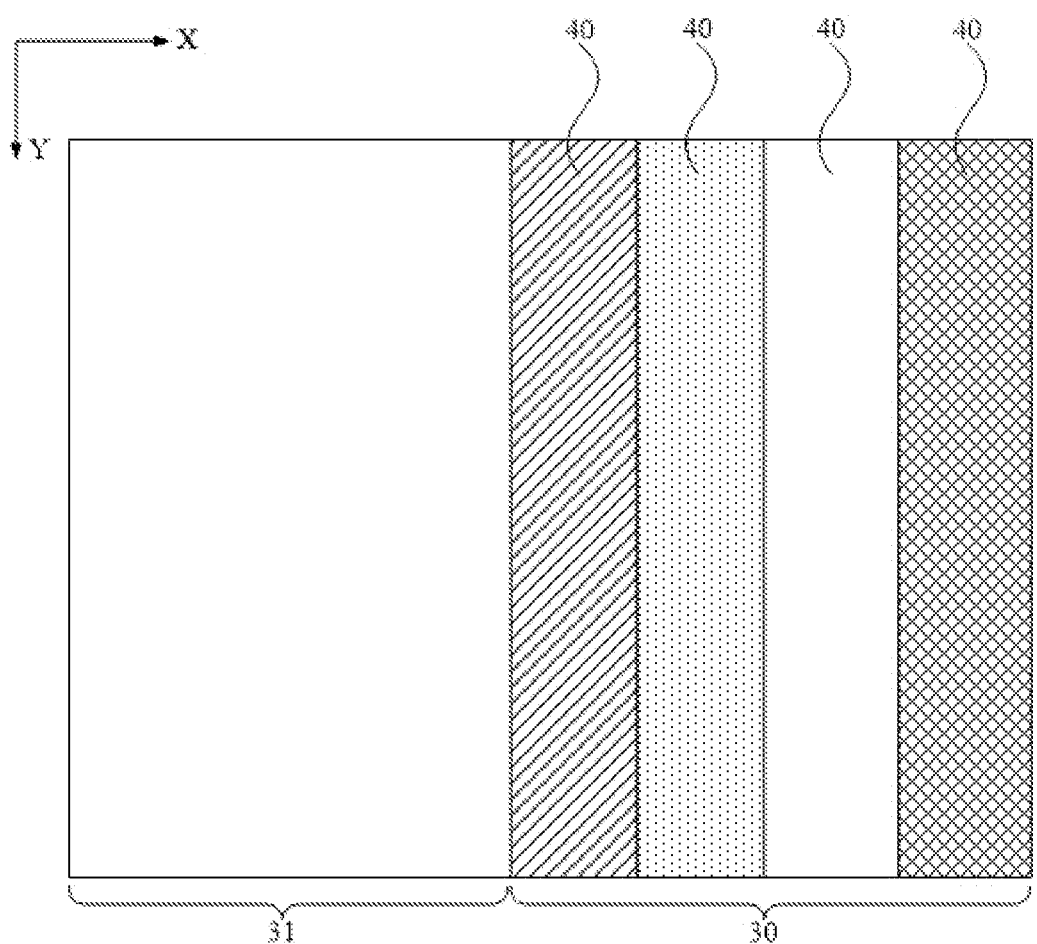
FIG. 3 is a schematic view showing the layout of a light-emitting element in the display circuitry according to one embodiment of the present disclosure.

As shown in FIGS. 2 and 3, the present disclosure provides in some embodiments a display panel including a plurality of display circuitries. Each display circuitry includes a display region 30 and a transparent region 31, the display region 30 includes a plurality of pixel driving circuitry setting regions 300 arranged sequentially in a first direction, and each pixel driving circuitry setting region 300 extends in a second direction intersecting the first direction. Each display circuitry includes a plurality of subpixels in one-to-one correspondence with the pixel driving circuitry setting regions, and each subpixel includes a subpixel driving circuitry and a light-emitting element 40 coupled to each other. The light-emitting element 40 is located at a side of the subpixel driving circuitry away from a substrate, and the subpixel driving circuitry and the light-emitting element 40 are located in a corresponding pixel driving circuitry setting region 300.

In the display panel with the above-mentioned structure, each pixel driving circuitry setting region may be of a strip-like structure extending in the second direction, and the subpixel driving circuitry and the light-emitting element 40 may be arranged in the corresponding pixel driving circuitry setting region 300, so the display panel with this structure may be applied to low-resolution transparent display. Along with an increase in the resolution of the display panel, in the case of ensuring a proportion of an area of the transparent region, a width of the pixel driving circuitry setting region 300 in the first direction may decrease, so that the pixel driving circuitry setting region 300 may be of an elongated structure extending in the second direction. In this regard, when the subpixel driving circuitry and the light-emitting element 40 are arranged in the pixel driving circuitry setting region 300, a width of each of the subpixel driving circuitry and the light-emitting element 40 in the first direction may decrease correspondingly, and a difficulty in the manufacture of the subpixel driving circuitry and the light-emitting element 40 may increase. As a result, cross color may easily occur for the display panel, and thereby a display effect of the display panel may be adversely affected.

As shown in FIGS. 2 and 4-17, the present disclosure provides in some embodiments a display panel, which includes a substrate, and a plurality of display circuitries arranged on the substrate. Each display circuitry includes a display region 30 and a transparent region 31, the display region 30 includes a plurality of pixel driving circuitry setting regions 300 arranged sequentially in a first direction (e.g., a first pixel driving circuitry setting region 3001, a second pixel driving circuitry setting region 3002, a third pixel driving circuitry setting region 3003 and a fourth pixel driving circuitry setting region 3004 in FIG. 2), and each pixel driving circuitry setting region 300 extends in a second direction intersecting the first direction. Each display circuitry includes a plurality of subpixels in one-to-one correspondence with the pixel driving circuitry setting regions 300, each subpixel includes a subpixel driving circuitry and a light-emitting element (e.g., a first light-emitting element 41, a second light-emitting element 42, a third light-emitting element 43 or a fourth light-emitting element 44 in FIG. 4) coupled to each other, and the subpixel driving circuitry is located in a corresponding pixel driving circuitry setting region 300. The light-emitting element is located at a side of the subpixel driving circuitry away from the substrate, a width L3 of the light-emitting element is greater than a width L1 of the corresponding pixel driving circuitry setting region in the first direction, and a length L4 of the light-emitting element is smaller than a length L2 of the corresponding pixel driving circuitry setting region in the second direction.

To be specific, as shown in FIGS. 2, 4, 11 and 12, the display panel may include the plurality of display circuitries arranged in an array form, and each display circuitry may include the display region 30 and the transparent region 31. For example, the transparent region 31 and the display region 30 may be arranged sequentially in the first direction. The display region 30 may be used to achieve a display function of the display panel, and the transparent region 31 may be used to achieve a light-transmitting function of the display panel.

The display region 30 may include the plurality of pixel driving circuitry setting regions 300 arranged sequentially in the first direction, and each pixel driving circuitry setting region 300 may extend in the second direction. For example, the pixel driving circuitry setting region 300 may be of a rectangular structure extending in the second direction. For example, the first direction may be a direction X, and the second direction may be a direction Y.

Each display circuitry may include the plurality of subpixels in one-to-one correspondence with the pixel driving circuitry setting regions 300, each subpixel may include the subpixel driving circuitry and the light-emitting element coupled to each other, and the subpixel driving circuitry may be located in the corresponding pixel driving circuitry setting region 300. For example, the subpixel driving circuitry may include transistors and a storage capacitor Cst, and be configured to provide a driving signal for the light-emitting element.

Figure 5:
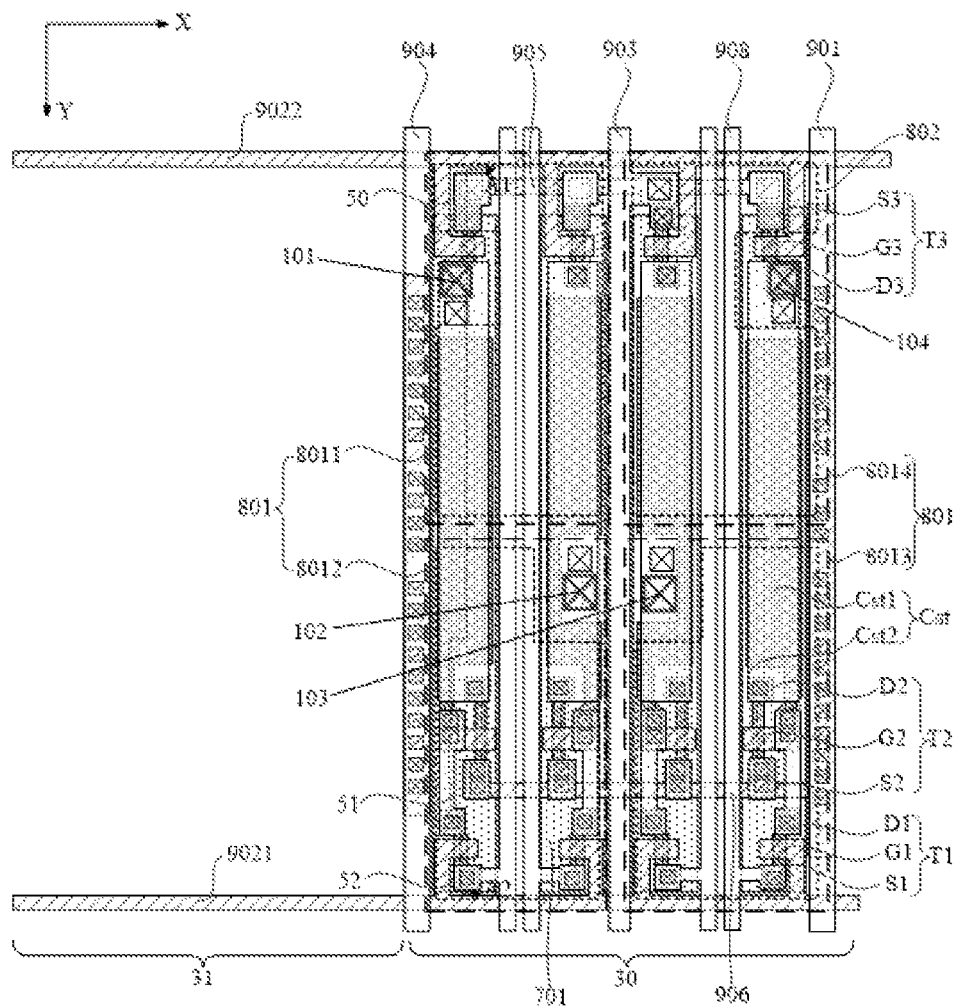
FIG. 5 is a schematic view showing the layout of subpixels in the display circuitry according to one embodiment of the present disclosure.
Figure 6:
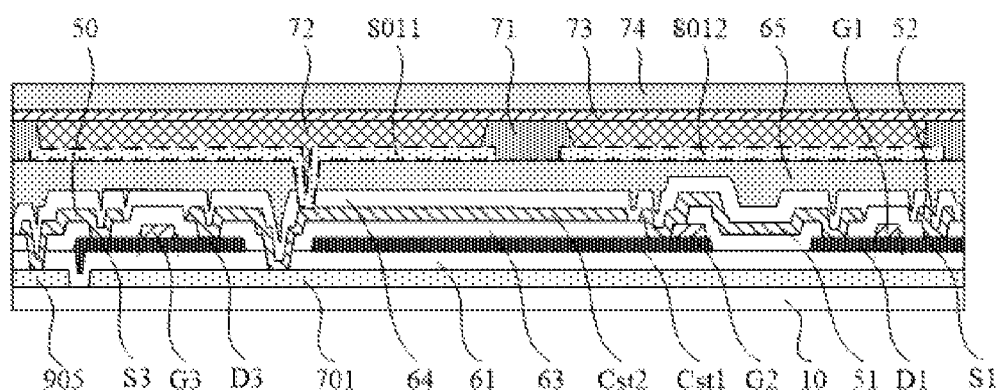
FIG. 6 is a sectional view of the display circuitry along line A1A2 in FIG. 5.
Figure 7:
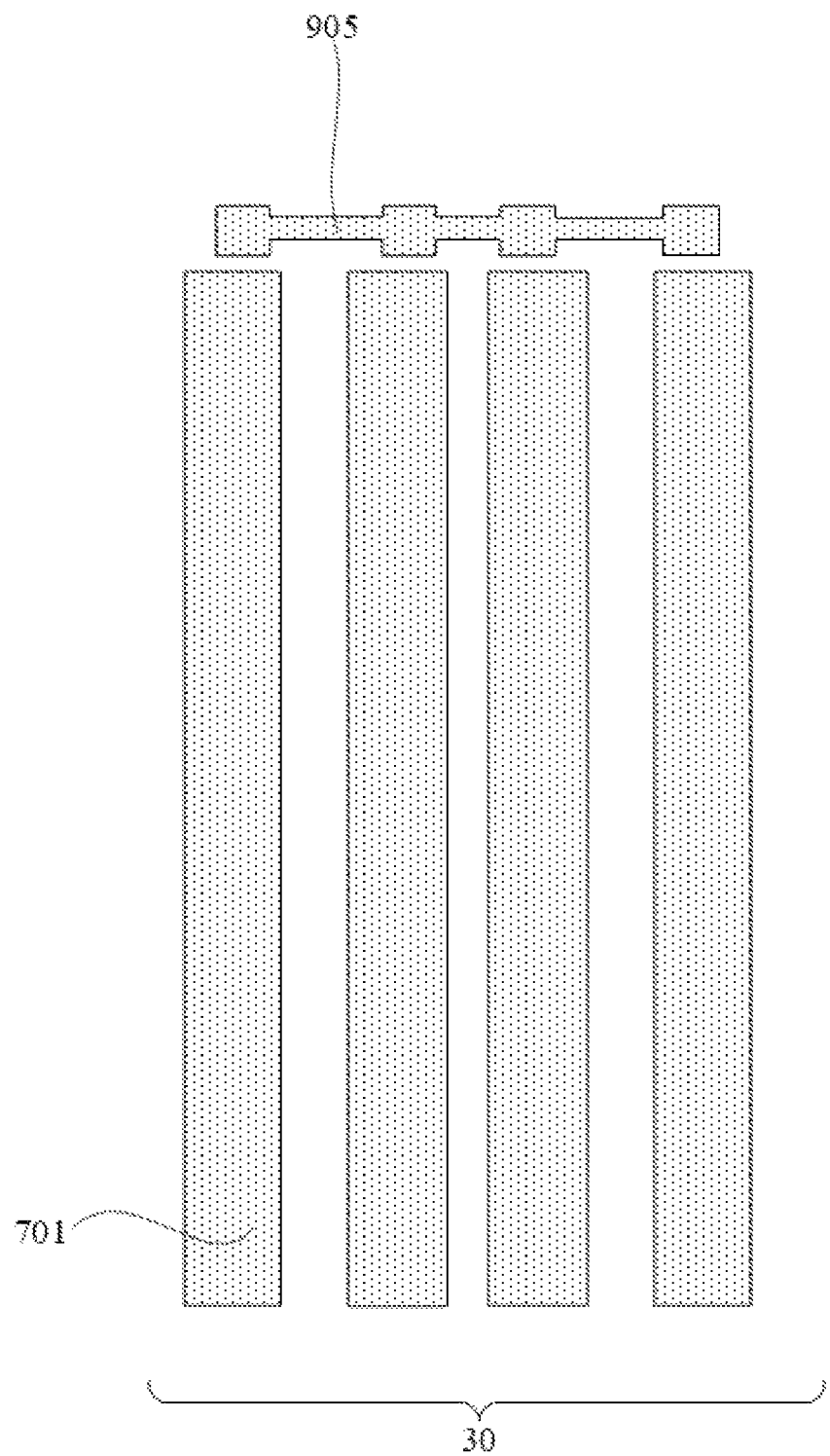
FIG. 7 is a schematic view showing the layout of a light-shielding layer in FIG. 6.
Figure 8:
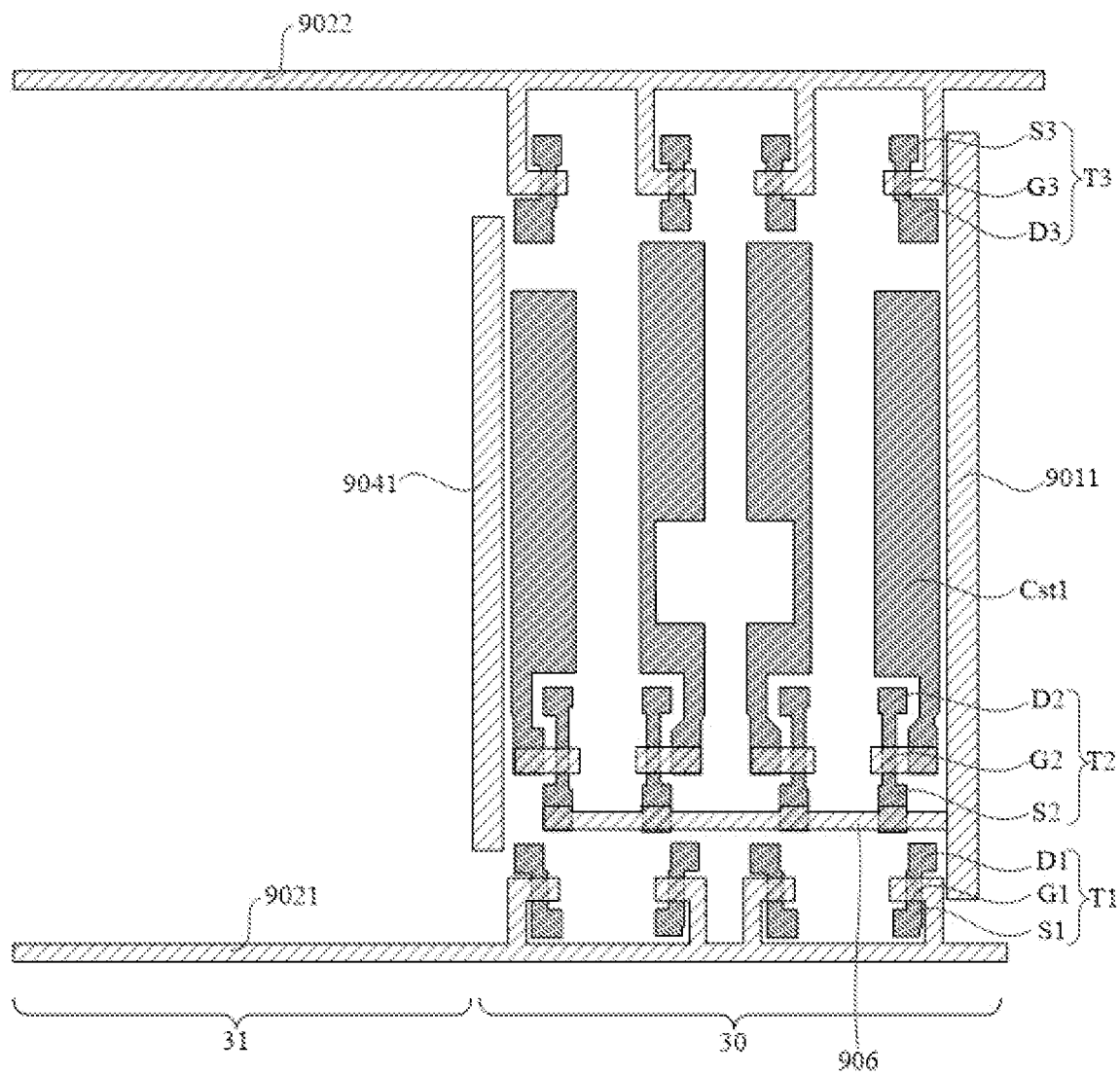
FIG. 8 is a schematic view showing the layout of an active layer and a first gate metal layer in FIG. 6.
Figure 9:
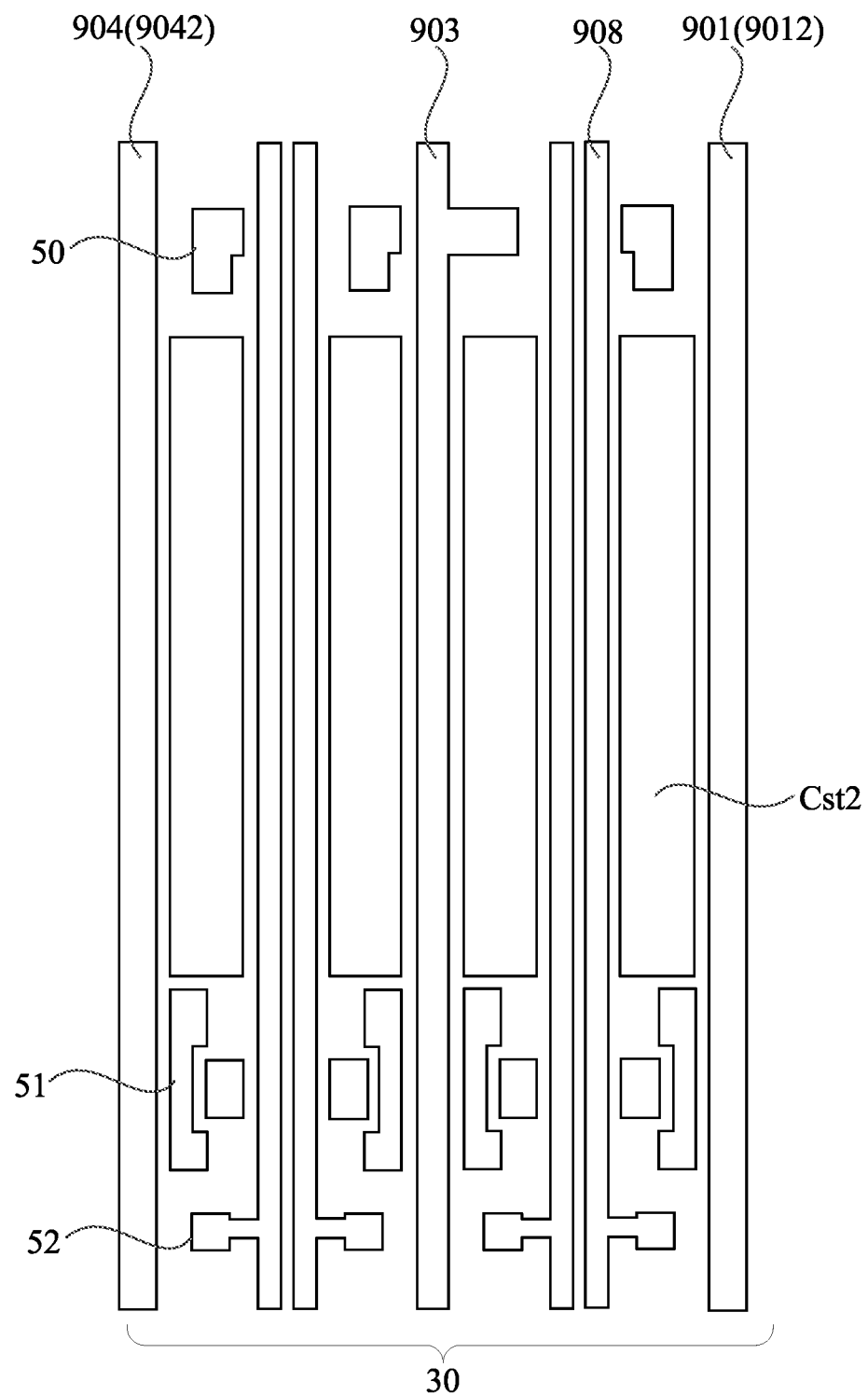
FIG. 9 is a schematic view showing the layout of a first source-drain metal layer in FIG. 6.
Figure 10:
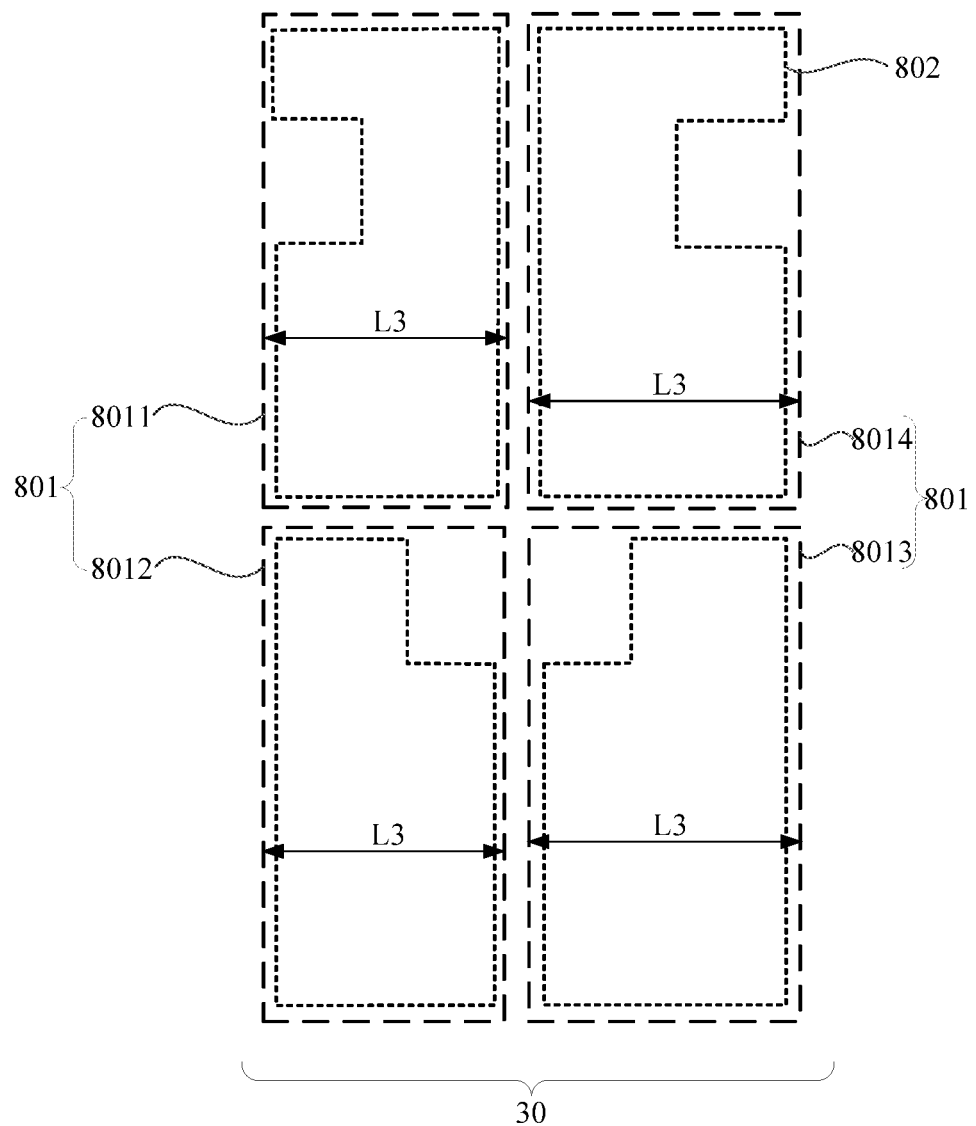
FIG. 10 is a schematic view showing the layout of an anode and a pixel aperture in FIG. 6.
Figure 17:
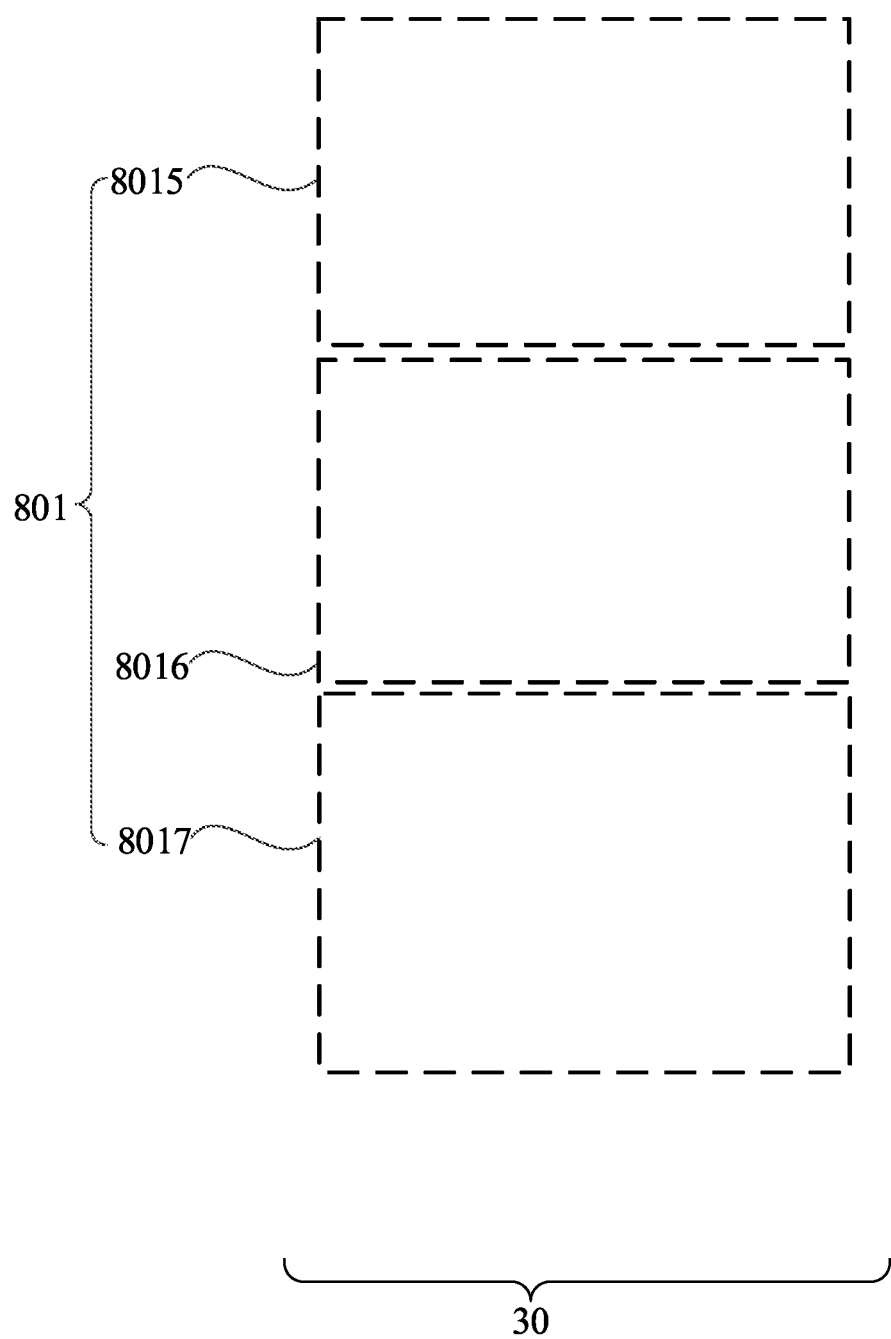
FIG. 17 is a schematic view showing the layout of an anode in FIG. 13.

As shown in FIGS. 5 and 6, the light-emitting element may be located at a side of the subpixel driving circuitry away from the substrate, and include an anode 801 (e.g., a first anode 8011, a second anode 8012, a third anode 8013 or a fourth anode 8014 in FIG. 5, or a fifth anode 8015, a sixth anode 8016 or a seventh anode 8017 in FIG. 17) and a light-emitting functional layer laminated one on another in a direction away from the substrate. An orthogonal projection of the anode 801 onto the substrate may overlap an orthogonal projection of the subpixel driving circuitry coupled thereto onto the substrate to form an overlapping region where the anode 801 is coupled to a second electrode D2 of a second transistor T2 in the subpixel driving circuitry through a via-hole so as to receive the driving signal form the subpixel driving circuitry. The light-emitting element may further include a cathode layer 73. For example, the cathode layer 73 may be located at a side of the light-emitting functional layer away from the substrate. The cathode layer 73 may be coupled to a negative power source signal line in the display circuitry, so as to receive a negative power source signal from the negative power source signal line.

It should be appreciated that, FIG. 6 further shows a first insulation layer 61, a third insulation layer 63, a fourth insulation layer 64, a planarization layer 65, a substrate 10, a packaging layer 74, a first conductive connection member 50, a second conductive connection member 51 and a third conductive connection member 52. In addition, the display panel may further include a second insulation layer (not shown). For example, the second insulation layer may be arranged between an active layer and a first gate metal layer, and an orthogonal projection of the second insulation layer onto the substrate may overlap an orthogonal projection of the first gate metal layer onto the substrate.

For example, the light-emitting functional layer may include an organic light-emitting material layer 72, and common layers with a whole-layer structure, e.g., an electron transporting layer (ETL), an electron injection layer (EIL), a hole transporting layer (HTL) and a hole injection layer (HIL). The organic light-emitting material layer 72 is configured to emit light in a corresponding color under the combined effect of the anode 801 and the cathode layer 73.

During the layout of the light-emitting element, the width of the light-emitting element may be greater than the width of the corresponding pixel driving circuitry setting region 300 in the first direction, and the length of the light-emitting element may be smaller than the length of the corresponding pixel driving circuitry setting region 300 in the second direction. Through this layout mode, it is able to increase the width of the light-emitting element in the first direction and reduce the length of the light-emitting element in the second direction, and enable an orthogonal projection of the light-emitting element onto the substrate to overlap orthogonal projections of at least two pixel driving circuitry setting regions 300 onto the substrate, thereby to prevent the light-emitting element from being of a same elongated structure as the pixel driving circuitry setting region 300.

Based on the specific structure of the display panel, in the display panel according to the embodiments of the present disclosure, the display region 30 may include the plurality of pixel driving circuitry setting regions 300 arranged sequentially in the first direction, and each pixel driving circuitry setting region 300 may extend in the second direction. Each display circuitry may include the plurality of subpixels in one-to-one correspondence with the pixel driving circuitry setting regions 300, and the subpixel driving circuitry in each subpixel may be located in the corresponding pixel driving circuitry setting region 300. The width of the light-emitting element in each subpixel may be greater than the width of the corresponding pixel driving circuitry setting region 300 in the first direction, and the length of the light-emitting element may be smaller than the length of the corresponding pixel driving circuitry setting region 300 in the second direction. Through the above arrangement mode, the orthogonal projection of the light-emitting element onto the substrate may overlap the orthogonal projections of at least two pixel driving circuitry setting regions 300 onto the substrate. At this time, even when the width of the pixel driving circuitry setting region 300 in the first direction decreases and thereby it is of the elongated structure extending in the second direction along with an increase in the resolution of the display panel, the light-emitting element may be still provided with an appropriate length-to-width ratio. As a result, it is able to prevent a difficulty in the manufacture of the light-emitting element from being increased, prevent the occurrence of cross color for the display panel, and ensure a good display effect of the display panel. Hence, according to the embodiments of the present disclosure, in the case of not increasing the manufacture difficulty, it is able for the display panel to achieve transparent display at high quality and high resolution in a better manner.

As shown in FIGS. 2, 5, 10, 11, 13 and 17, in some embodiments of the present disclosure, the light-emitting element may include an anode 801, a first light-emitting functional layer and a color filter pattern laminated one on another in a direction away from the substrate, and the anode 801 may be coupled to a corresponding subpixel driving circuitry. A width of the anode 801 may be greater than the width of the corresponding pixel driving circuitry setting region 300 in the first direction, a length of the anode 801 may be smaller than the length of the corresponding pixel driving circuitry setting region in the second direction, a width of the color filter pattern may be greater than the width of the corresponding pixel driving circuitry setting region 300 in the first direction, and a length of the color filter pattern may be smaller than the length of the corresponding pixel driving circuitry setting region in the second direction.

To be specific, the light-emitting element may include the anode 801, the first light-emitting functional layer and the color filter pattern laminated one on another in the direction away from the substrate. For example, the first light-emitting functional layer may emit white light, and may be of a whole-layer structure. For example, the display panel may include a cover plate, and the color filter pattern may be formed at a side of the cover plate facing the substrate. For example, the color filter pattern may include a red color filter pattern, a blue color filter pattern and a green color filter pattern. For another example, the color filter pattern may include a red color filter pattern, a blue color filter pattern, a white color filter pattern and a green color filter pattern.

When the width of the anode 801 is greater than the width of the corresponding pixel driving circuitry setting region 300 in the first direction and the length of the anode 801 is smaller than the length of the corresponding pixel driving circuitry setting region in the second direction, the orthogonal projection of the anode 801 onto the substrate may overlap orthogonal projections of at least two pixel driving circuitry setting regions 300 onto the substrate. At this time, even when the width of the pixel driving circuitry setting region 300 in the first direction decreases and thereby it is of the elongated structure extending in the second direction along with the increase in the resolution of the display panel, the anode 801 may be still provided with an appropriate length-to-width ratio. As a result, it is able to prevent a difficulty in the manufacture of the anode 801 from being increased, prevent the occurrence of cross color for the display panel, and ensure the good display effect of the display panel.

Identically, when the width of the color filter pattern is greater than the width of the corresponding pixel driving circuitry setting region 300 in the first direction and the length of the color filter pattern is smaller than the length of the corresponding pixel driving circuitry setting region in the second direction, the orthogonal projection of the color filter pattern onto the substrate may overlap the orthogonal projections of at least two pixel driving circuitry setting regions 300 onto the substrate. At this time, even when the width of the pixel driving circuitry setting region 300 in the first direction decreases and thereby it is of the elongated structure extending in the second direction along with the increase in the resolution of the display panel, the color filter pattern may be still provided with an appropriate length-to-width ratio. As a result, it is able to prevent a difficulty in the manufacture of the color filter pattern from being increased, prevent the occurrence of cross color for the display panel, and ensure the good display effect of the display panel.

As shown in FIGS. 2, 5, 10, 11, 13 and 17, in some embodiments of the present disclosure, the light-emitting element may include an anode 801 and a second light-emitting functional layer laminated one on another in a direction away from the substrate, and the anode 801 may be coupled to a corresponding subpixel driving circuitry. A width of the anode 801 may be greater than the width of the corresponding pixel driving circuitry setting region 300 in the first direction, a length of the anode 801 may be smaller than the length of the corresponding pixel driving circuitry setting region in the second direction, a width of the second light-emitting functional layer may be greater than the width of the corresponding pixel driving circuitry setting region 300 in the first direction, and a length of the second light-emitting functional layer may be smaller than the length of the corresponding pixel driving circuitry setting region in the second direction.

To be specific, the light-emitting element may include the anode 801 and the second light-emitting functional layer laminated one on another in the direction away from the substrate. For example, the second light-emitting functional layer may include an organic light-emitting material layer capable of emitting red light, green light, blue light or white light. The display circuitry may further include a pixel definition layer 71 provided with pixel apertures 802 in one-to-one correspondence with the subpixels, and the organic light-emitting material layer may be arranged in the corresponding pixel aperture 802.

It should be appreciated that, when the light-emitting element includes the anode 801 and the second light-emitting functional layer, the display panel may not be provided with any color filter pattern.

When the width of the anode 801 is greater than the width of the pixel driving circuitry setting region 300 in the first direction and the length of the anode 801 is smaller than the length of the pixel driving circuitry setting region 300 in the second direction, an orthogonal projection of the anode 801 onto the substrate may overlap orthogonal projections of at least two pixel driving circuitry setting regions 300 onto the substrate. At this time, even when the width of the pixel driving circuitry setting region 300 in the first direction decreases and thereby it is of the elongated structure extending in the second direction along with the increase in the resolution of the display panel, the anode 801 may be still provided with an appropriate length-to-width ratio. As a result, it is able to prevent a difficulty in the manufacture of the anode 801 from being increased, prevent the occurrence of cross color for the display panel, and ensure the good display effect of the display panel.

Identically, when the width of the second light-emitting functional layer is greater than the width of the pixel driving circuitry setting region 300 in the first direction and the length of the second light-emitting functional layer is smaller than the length of the pixel driving circuitry setting region 300 in the second direction, an orthogonal projection of the second light-emitting functional layer onto the substrate may overlap orthogonal projections of at least two pixel driving circuitry setting regions 300 onto the substrate. At this time, even when the width of the pixel driving circuitry setting region 300 in the first direction decreases and thereby it is of the elongated structure extending in the second direction along with the increase in the resolution of the display panel, the second light-emitting functional layer may be still provided with an appropriate length-to-width ratio. As a result, it is able to prevent a difficulty in the manufacture of the second light-emitting functional layer from being increased, prevent the occurrence of cross color for the display panel, and ensure the good display effect of the display panel.

Figure 4:
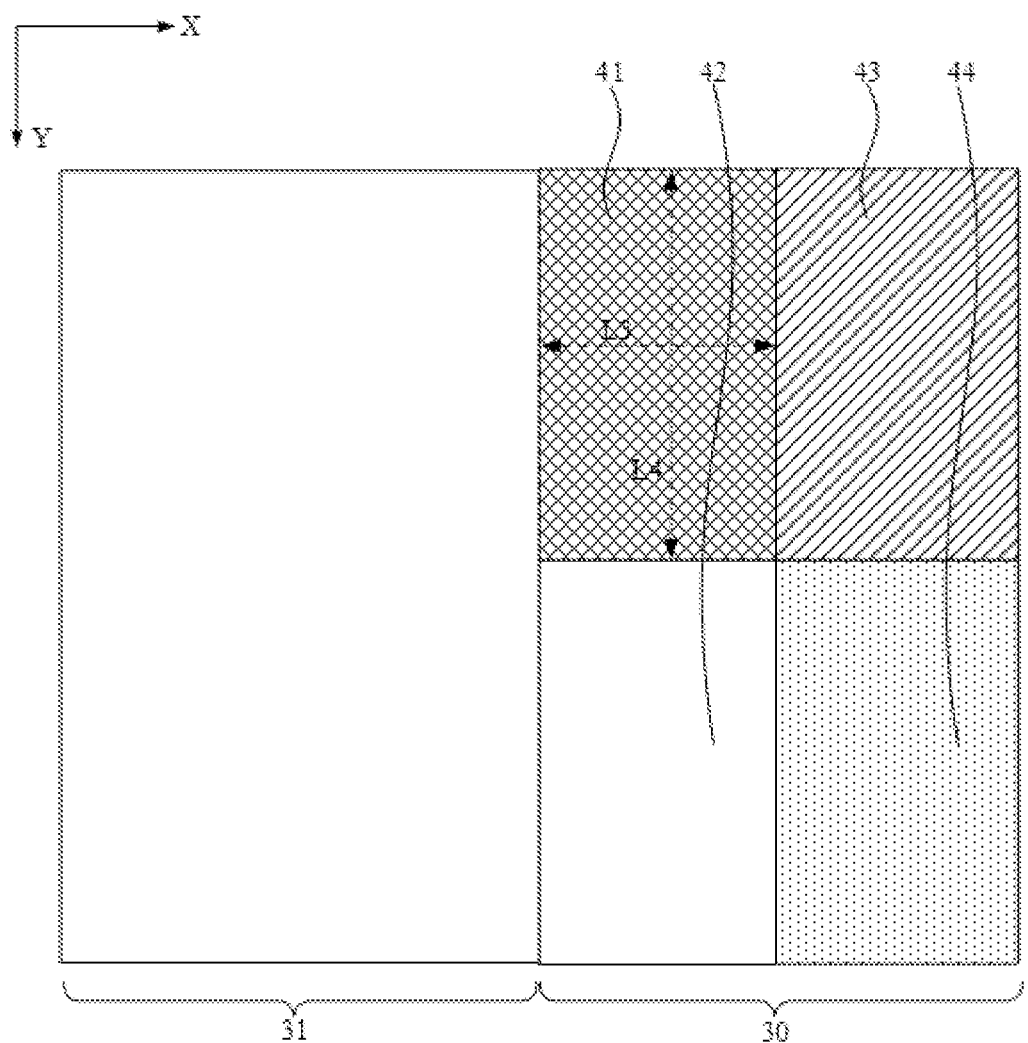
FIG. 4 is another schematic view showing the layout of the light-emitting element in the display circuitry according to one embodiment of the present disclosure.

As shown in FIG. 4, in some embodiments of the present disclosure, light-emitting elements (e.g., the first light-emitting element 41, the second light-emitting element 42, the third light-emitting element 43 and the fourth light-emitting element 44 in FIG. 4) of the plurality of subpixels in each display circuitry may be arranged in an array form, an orthogonal projection of the light-emitting element of each subpixel onto the substrate may overlap orthogonal projections of at least two adjacent pixel driving circuitry setting regions 300 in the display region 30 where the subpixel is located onto the substrate, and the at least two pixel driving circuitry setting regions 300 may include a pixel driving circuitry setting region 300 corresponding to the subpixel.

To be specific, the light-emitting elements of the plurality of subpixels in the display circuitry may be arranged in various modes. For example, the light-emitting elements of the plurality of subpixels in the display circuitry may be arranged in an array form, i.e., arranged in rows and columns. The light-emitting elements in a same row may be arranged sequentially in the first direction, and the light-emitting elements in a same column may be arranged sequentially in the second direction.

For example, the orthogonal projection of the light-emitting element of each subpixel onto the substrate may overlap the orthogonal projections of at least two adjacent pixel driving circuitry setting regions 300 in the display region 30 where the subpixel is located onto the substrate, and the at least two pixel driving circuitry setting regions 300 may include the pixel driving circuitry setting region 300 corresponding to the subpixel. When the at least two pixel driving circuitry setting regions 300 include the pixel driving circuitry setting region 300 corresponding to the subpixel, the light-emitting element of the subpixel may overlap the subpixel driving circuitry in the corresponding pixel driving circuitry setting region 300 and be coupled to the corresponding subpixel driving circuitry at an overlapping region, so as to receive the driving signal from the subpixel driving circuitry.

In the display panel according to the embodiments of the present disclosure, the orthogonal projection of the light-emitting element of each subpixel onto the substrate may overlap the orthogonal projections of at least two adjacent pixel driving circuitry setting regions 300 in the display region 30 where the subpixel is located onto the substrate, so as to provide each light-emitting element with an appropriate length-to-width ration, thereby to prevent a difficulty in the manufacture of the second light-emitting functional layer from being increased, prevent the occurrence of cross color for the display panel, and ensure the good display effect of the display panel.

As shown in FIGS. 2, and 4-10, in some embodiments of the present disclosure, the display region 30 may include a first pixel driving circuitry setting region 3001, a second pixel driving circuitry setting region 3002, a third pixel driving circuitry setting region 3003 and a fourth pixel driving circuitry setting region 3004 arranged sequentially in the first direction. Each display circuitry may include a first subpixel, a second subpixel, a third subpixel and a fourth subpixel. The first subpixel may include a first light-emitting element 41, the second subpixel may include a second light-emitting element 42, the third subpixel may include a third light-emitting element 43, and the fourth subpixel may include a fourth light-emitting element 44.

The first light-emitting element 41 and the second light-emitting element 42 may be arranged in the second direction, an orthogonal projection of the first light-emitting element 41 onto the substrate may overlap an orthogonal projection of the first pixel driving circuitry setting region 3001 onto the substrate and an orthogonal projection of the second pixel driving circuitry setting region 3002 onto the substrate, and an orthogonal projection of the second light-emitting element 42 onto the substrate may overlap the orthogonal projection of the first pixel driving circuitry setting region 3001 onto the substrate and the orthogonal projection of the second pixel driving circuitry setting region 3002 onto the substrate. The third light-emitting element 43 and the fourth light-emitting element 44 may be arranged in the second direction, an orthogonal projection of the third light-emitting element 43 onto the substrate may overlap an orthogonal projection of the third pixel driving circuitry setting region 3003 onto the substrate and an orthogonal projection of the fourth pixel driving circuitry setting region 3004 onto the substrate, and an orthogonal projection of the fourth light-emitting element 44 onto the substrate may overlap the orthogonal projection of the third pixel driving circuitry setting region 3003 onto the substrate and the orthogonal projection of the fourth pixel driving circuitry setting region 3004 onto the substrate.

To be specific, as shown in FIGS. 2 and 4, the display region 30 may include the first pixel driving circuitry setting region 3001, the second pixel driving circuitry setting region 3002, the third pixel driving circuitry setting region 3003 and the fourth pixel driving circuitry setting region 3004 arranged sequentially in the first direction. Each display circuitry may include the first subpixel, the second subpixel, the third subpixel and the fourth subpixel. The first subpixel may include the first subpixel driving circuitry and the first light-emitting element 41 coupled to each other, and the first subpixel driving circuitry may be arranged in the corresponding first pixel driving circuitry setting region 3001. The second subpixel may include the second subpixel driving circuitry and the second light-emitting element 42 coupled to each other, and the second subpixel driving circuitry may be arranged in the corresponding second pixel driving circuitry setting region 3002. The third subpixel may include the third subpixel driving circuitry and the third light-emitting element 43 coupled to each other, and the third subpixel driving circuitry may be arranged in the corresponding third pixel driving circuitry setting region 3003. The fourth subpixel may include the fourth subpixel driving circuitry and the fourth light-emitting element 44 coupled to each other, and the fourth subpixel driving circuitry may be arranged in the corresponding fourth pixel driving circuitry setting region 3004.

For example, the first light-emitting element 41, the second light-emitting element 42, the third light-emitting element 43 and the fourth light-emitting element 44 may be arranged in an array form, i.e., in two rows and two columns. The light-emitting elements in a first column may include the first light-emitting element 41 and the second light-emitting element 42 arranged sequentially in the second direction, the orthogonal projection of the first light-emitting element 41 onto the substrate may overlap the orthogonal projection of the first pixel driving circuitry setting region 3001 onto the substrate and the orthogonal projection of the second pixel driving circuitry setting region 3002 onto the substrate, and the orthogonal projection of the second light-emitting element 42 onto the substrate may overlap the orthogonal projection of the orthogonal projection of the first pixel driving circuitry setting region 3001 onto the substrate and the orthogonal projection of the second pixel driving circuitry setting region 3002 onto the substrate.

The light-emitting elements in a second column may include the third light-emitting element 43 and the fourth light-emitting element 44 arranged sequentially in the second direction, the orthogonal projection of the third light-emitting element 43 onto the substrate may overlap the orthogonal projection of the third pixel driving circuitry setting region 3003 onto the substrate and the orthogonal projection of the fourth pixel driving circuitry setting region 3004 onto the substrate, and the orthogonal projection of the fourth light-emitting element 44 onto the substrate may overlap the orthogonal projection of the orthogonal projection of the third pixel driving circuitry setting region 3003 onto the substrate and the orthogonal projection of the fourth pixel driving circuitry setting region 3004 onto the substrate.

It should be appreciated that, the first light-emitting element 41 and the third light-emitting element 43 may be arranged in the first direction in a first row, and the second light-emitting element 42 and the fourth light-emitting element 44 may be arranged in the second direction in a second row.

When the display panel is provided with the above structure, taking a 55-inch 4k display panel as an example, as shown in FIG. 2, the display region 30 may have a size of 314.2 µm*314.2 µm. As shown in FIG. 3, on average, the light-emitting element 40 of each subpixel may have a size of 78.55 µm*314.2 µm. As shown in FIG. 4, on average, the light-emitting element of each subpixel (e.g., 41, 42, 43 or 44) may have a size of 157.1 µm*157.1 µm. Through comparison, it is found that the difficulty in the manufacture of the light-emitting element in the embodiments of the present disclosure may be relatively small.

As shown in FIGS. 4 and 5, in some embodiments of the present disclosure, the first subpixel may further include a first subpixel driving circuitry, the first subpixel driving circuitry may include a first storage capacitor, the first light-emitting element 41 may include a first anode 8011, and an orthogonal projection of the first anode 8011 onto the substrate may overlap an orthogonal projection of a second electrode plate of the first storage capacitor onto the substrate to form an overlapping region where the first anode 8011 is coupled to the second electrode plate of the first storage capacitor through a first connection hole 101.

The second subpixel may further include a second subpixel driving circuitry, the second subpixel driving circuitry may include a second storage capacitor, the second light-emitting element 42 may include a second anode 8012, and an orthogonal projection of the second anode 8012 onto the substrate may overlap an orthogonal projection of a second electrode plate of the second storage capacitor onto the substrate to form an overlapping region where the second anode 8012 is coupled to the second electrode plate of the second storage capacitor through a second connection hole 102.

The third subpixel may further include a third subpixel driving circuitry, the third subpixel driving circuitry may include a third storage capacitor, the third light-emitting element 43 may include a third anode 8013, and an orthonal projection of the third anode 8013 onto the substrate may overlap an orthogonal projection of a second electrode plate of the third storage capacitor onto the substrate to form an overlapping region where the third anode 8013 is coupled to the second electrode plate of the third storage capacitor through a third connection hole 103.

The fourth subpixel may further include a fourth subpixel driving circuitry, the fourth subpixel driving circuitry may include a fourth storage capacitor, the fourth light-emitting element 44 may include a fourth anode 8014, and an orthogonal projection of the fourth anode 8014 onto the substrate may overlap an orthogonal projection of a second electrode plate of the fourth storage capacitor onto the substrate to form an overlapping region where the fourth anode 8014 is coupled to the second electrode plate of the fourth storage capacitor through a fourth connection hole 104.

The first connection hole 101 and the fourth connection hole 104 may be arranged in the first direction, and the second connection hole 102 and the third connection hole 103 may be arranged in the first direction.

To be specific, the first connection hole 101, the second connection hole 102, the third connection hole 103 and the fourth connection hole 104 may be arranged in various modes.

For example, the first connection hole 101 and the fourth connection hole 104 may each be arranged at a position adjacent to a corresponding third transistor T3, the second connection hole 102 and the third connection hole 103 may each be arranged at a position in proximity to a middle position of the corresponding pixel driving circuitry setting region, and the middle position may be a middle position of the pixel driving circuitry setting region in the second direction.

For example, the first connection hole 101 and the fourth connection hole 104 may be arranged in the first direction, and the second connection hole 102 and the third connection hole 103 may be arranged in the first direction. The first connection hole and the second connection hole 102 may be arranged in a staggered manner in the first direction.

When the first connection hole 101, the second connection hole 102, the third connection hole 103 and the fourth connection hole 104 are arranged as mentioned hereinabove, the connection holes corresponding to different subpixels in one display region 30 may be distributed evenly, so as to ensure the display quality of the display panel in a better manner.

In some embodiments of the present disclosure, the first subpixel may include a blue subpixel B, the second subpixel may include a white subpixel W, the fourth subpixel may include a red subpixel R, and the third subpixel may include a green subpixel G.

Figure 11:
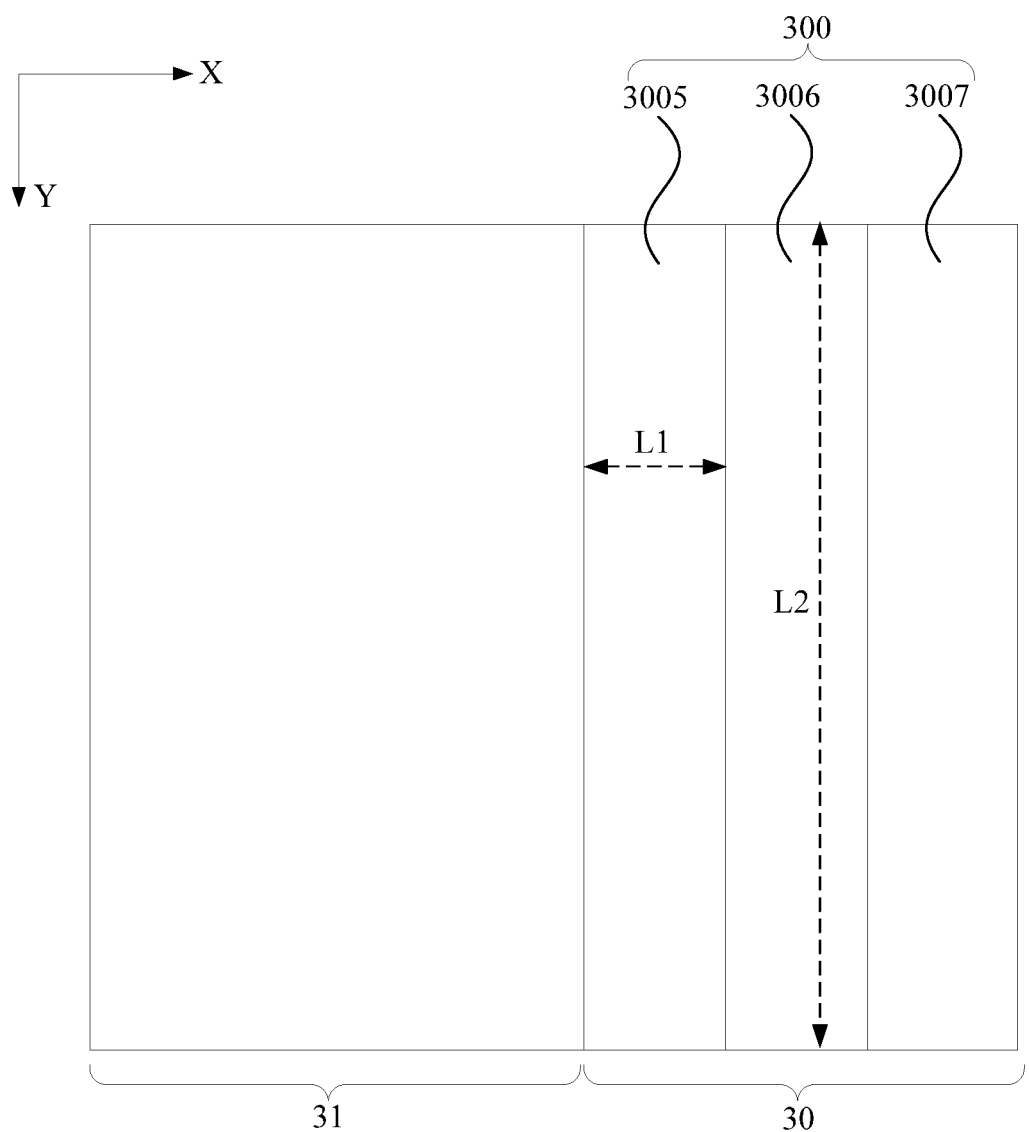
FIG. 11 is another schematic view showing the display region and the transparent region in the display circuitry according to one embodiment of the present disclosure.
Figure 12:
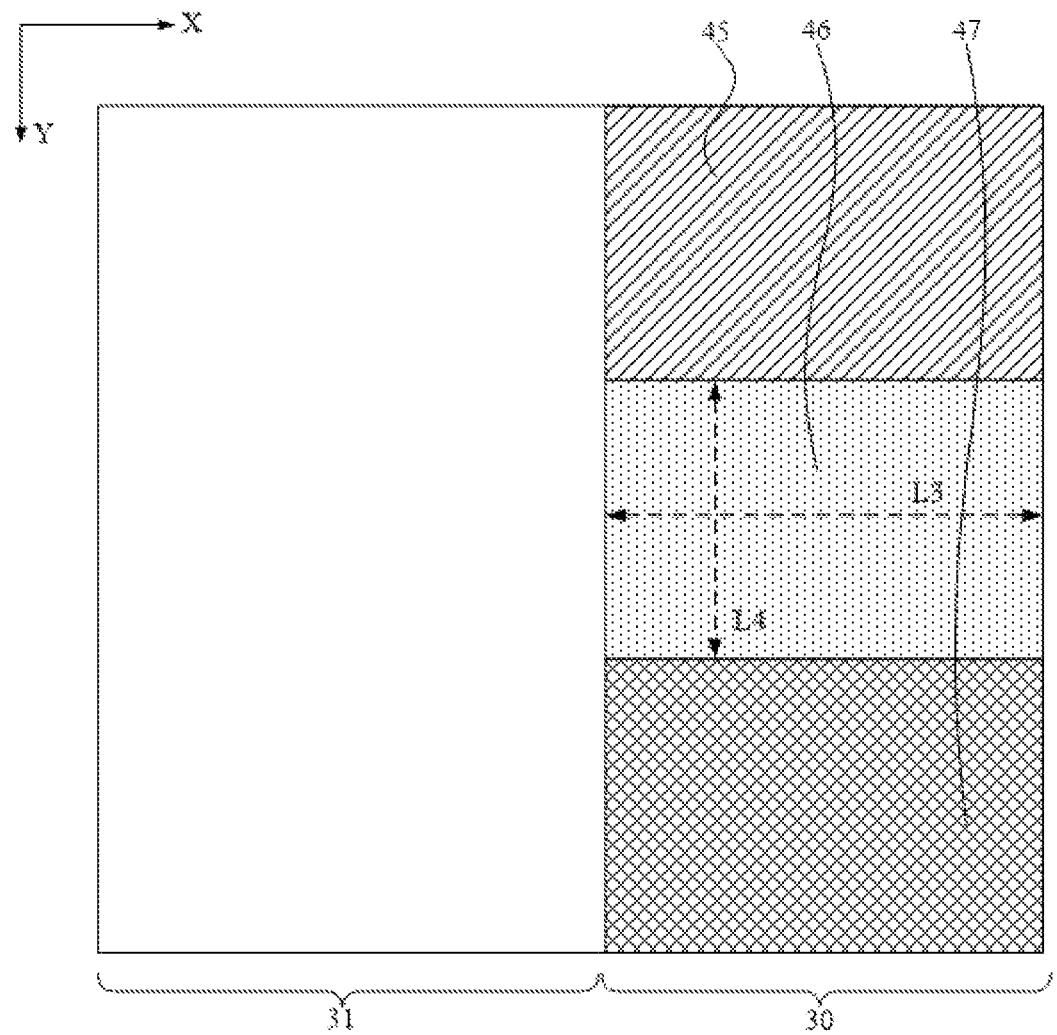
FIG. 12 is yet another schematic view showing the layout of the light-emitting element in the display circuitry according to one embodiment of the present disclosure.

As shown in FIGS. 11 and 12, in some embodiments of the present disclosure, the light-emitting elements (e.g., the fifth light-emitting element 45, the sixth light-emitting element 46 and the seventh light-emitting element 47 in FIG. 12) of the plurality of subpixels in each display circuitry may be arranged sequentially in the second direction, and an orthogonal projection of the light-emitting element of each subpixel onto the substrate may overlap orthogonal projections of the pixel driving circuitry setting regions 300 in the display region 30 where the subpixel is located onto the substrate.

To be specific, the light-emitting elements of the plurality of subpixels in the display circuitry may be arranged in various modes. For example, the light-emitting elements of the plurality of subpixels in the display circuitry may be arranged sequentially in the second direction, so as to form a column of light-emitting elements extending in the second direction.

For example, the orthogonal projection of the light-emitting element of each subpixel onto the substrate may overlap the orthogonal projections of the pixel driving circuitry setting regions 300 in the display region 30 where the subpixel is located onto the substrate. An orthogonal projection of the anode of the light-emitting element of the subpixel onto the substrate may overlap the orthogonal projection of the corresponding subpixel driving circuitry onto the substrate to form an overlapping region where the anode is coupled to the subpixel driving circuitry, so as to receive a driving signal from the subpixel driving circuitry.

In the display panel according to the embodiments of the present disclosure, the orthogonal projection of the light-emitting element of each subpixel onto the substrate may overlap the orthogonal projections of the pixel driving circuitry setting regions in the display region 30 where the subpixel is located onto the substrate, so as to provide each light-emitting element with an appropriate length-to-width ration. As a result, it is able to prevent a difficulty in the manufacture of the second light-emitting functional layer from being increased, prevent the occurrence of cross color for the display panel, and ensure the good display effect of the display panel.

As shown in FIGS. 11 to 17, in some embodiments of the present disclosure, the display region 30 may include a fifth pixel driving circuitry setting region 3005, a sixth pixel driving circuitry setting region 3006 and a seventh pixel driving circuitry setting region 3007 arranged sequentially in the first direction. Each display circuitry may include a fifth subpixel, a sixth subpixel and a seventh subpixel, the fifth subpixel may include a fifth light-emitting element 45, the sixth subpixel may include a sixth light-emitting element 46, the seventh subpixel may include a seventh light-emitting element 47, and the fifth light-emitting element 45, the sixth light-emitting element 46 and the seventh light-emitting element 47 may be arranged sequentially in the second direction.

An orthogonal projection of the fifth light-emitting element 45 onto the substrate may overlap an orthogonal projection of the fifth pixel driving circuitry setting region 3005 onto the substrate, an orthogonal projection of the sixth pixel driving circuitry setting region 3006 onto the substrate, and an orthogonal projection of the seventh pixel driving circuitry setting region 3007 onto the substrate.

An orthogonal projection of the sixth light-emitting element 46 onto the substrate may overlap the orthogonal projection of the fifth pixel driving circuitry setting region 3005 onto the substrate, the orthogonal projection of the sixth pixel driving circuitry setting region 3006 onto the substrate, and the orthogonal projection of the seventh pixel driving circuitry setting region 3007 onto the substrate.

An orthogonal projection of the seventh light-emitting element 47 onto the substrate may overlap the orthogonal projection of the fifth pixel driving circuitry setting region 3005 onto the substrate, the orthogonal projection of the sixth pixel driving circuitry setting region 3006 onto the substrate, and the orthogonal projection of the seventh pixel driving circuitry setting region 3007 onto the substrate.

To be specific, the display region 30 may include the fifth pixel driving circuitry setting region 3005, the sixth pixel driving circuitry setting region 3006 and the seventh pixel driving circuitry setting region 3007 arranged sequentially in the first direction. Each display circuitry may include the fifth subpixel, the sixth subpixel and the seventh subpixel.

The fifth subpixel may include a fifth subpixel driving circuitry and the fifth light-emitting element 45 coupled to each other, and the fifth subpixel driving circuitry may be arranged in the corresponding fifth pixel driving circuitry setting region 3005. The sixth subpixel may include a sixth subpixel driving circuitry and the sixth light-emitting element 46 coupled to each other, and the sixth subpixel driving circuitry may be arranged in the corresponding sixth pixel driving circuitry setting region 3006. The seventh subpixel may include a seventh subpixel driving circuitry and the seventh light-emitting element 47 coupled to each other, and the seventh subpixel driving circuitry may be arranged in the corresponding seventh pixel driving circuitry setting region 3007.

For example, the orthogonal projection of the fifth light-emitting element 45 onto the substrate may overlap the orthogonal projection of the fifth pixel driving circuitry setting region onto the substrate, the orthogonal projection of the sixth pixel driving circuitry setting region onto the substrate, and the orthogonal projection of the seventh pixel driving circuitry setting region onto the substrate. The orthogonal projection of the fifth light-emitting element 45 onto the substrate may overlap an orthogonal projection of a corresponding subpixel driving circuitry onto the substrate to form an overlapping region where the fifth light-emitting element 45 is coupled to the corresponding subpixel driving circuitry through a via-hole, so as to receive a driving signal from the subpixel driving circuitry.

The orthogonal projection of the sixth light-emitting element 46 onto the substrate may overlap the orthogonal projection of the fifth pixel driving circuitry setting region onto the substrate, the orthogonal projection of the sixth pixel driving circuitry setting region onto the substrate, and the orthogonal projection of the seventh pixel driving circuitry setting region onto the substrate. The orthogonal projection of the sixth light-emitting element 46 onto the substrate may overlap an orthogonal projection of a corresponding subpixel driving circuitry onto the substrate to form an overlapping region where the sixth light-emitting element 46 is coupled to the corresponding subpixel driving circuitry through a via-hole, so as to receive a driving signal from the subpixel driving circuitry.

The orthogonal projection of the seventh light-emitting element 47 onto the substrate may overlap the orthogonal projection of the fifth pixel driving circuitry setting region onto the substrate, the orthogonal projection of the sixth pixel driving circuitry setting region onto the substrate, and the orthogonal projection of the seventh pixel driving circuitry setting region onto the substrate. The orthogonal projection of the seventh light-emitting element 47 onto the substrate may overlap an orthogonal projection of a corresponding subpixel driving circuitry onto the substrate to form an overlapping region where the seventh light-emitting element 47 is coupled to the corresponding subpixel driving circuitry through a via-hole, so as to receive a driving signal from the subpixel driving circuitry.

Figure 13:
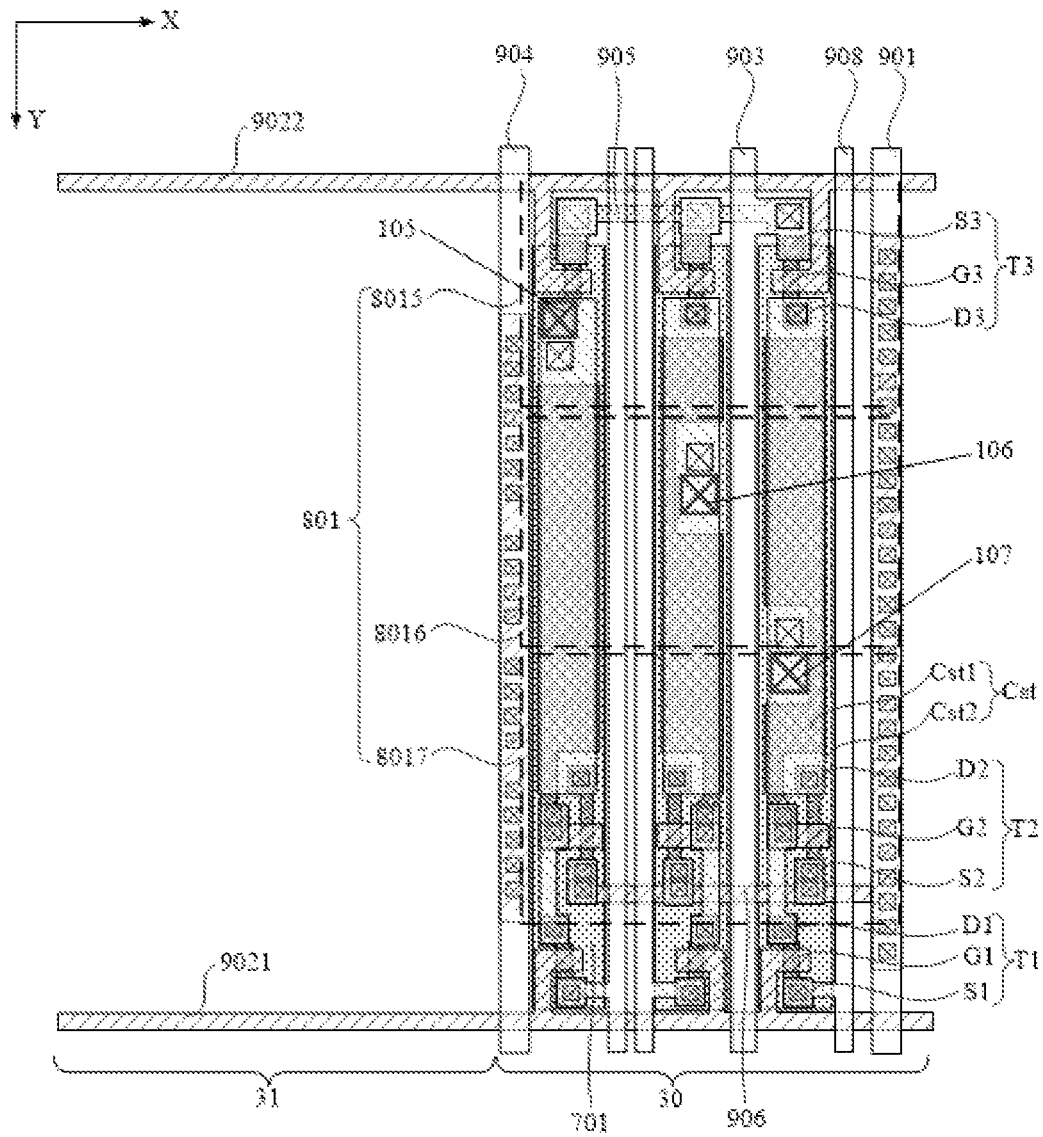
FIG. 13 is another schematic view showing the layout of the subpixels in the display circuitry according to one embodiment of the present disclosure.
Figure 14:
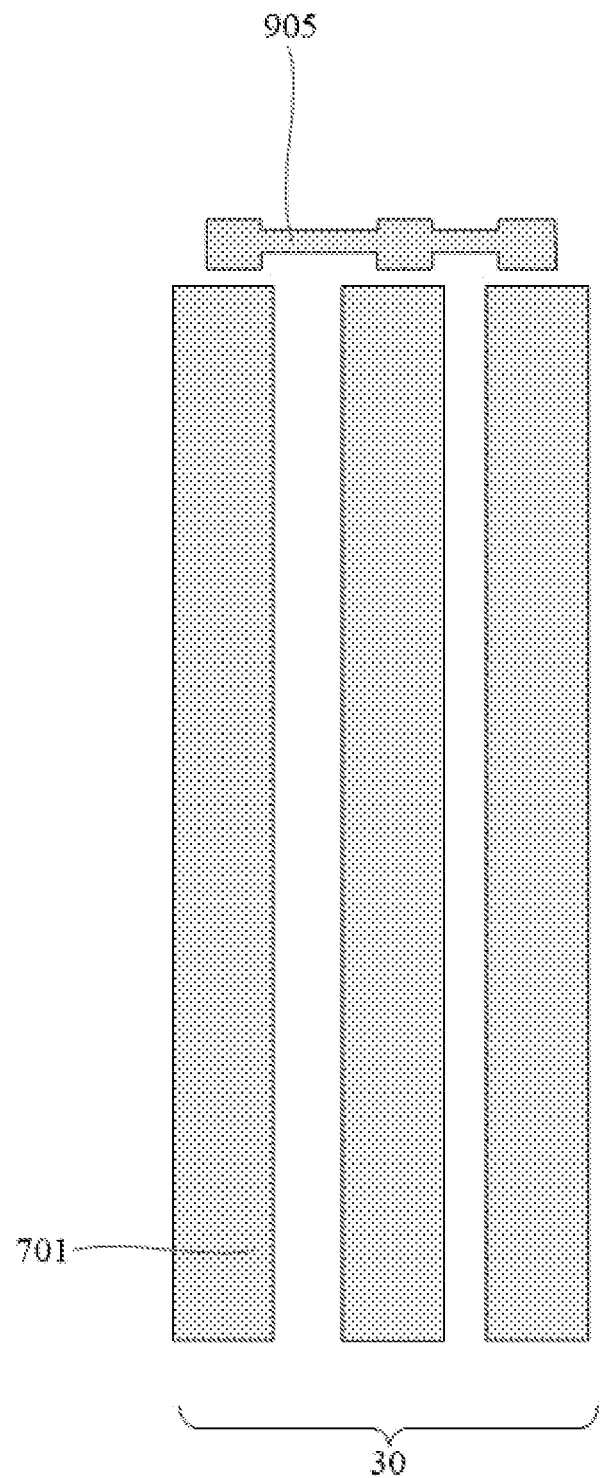
FIG. 14 is a schematic view showing the layout of a light-shielding layer in FIG. 13.
Figure 15:
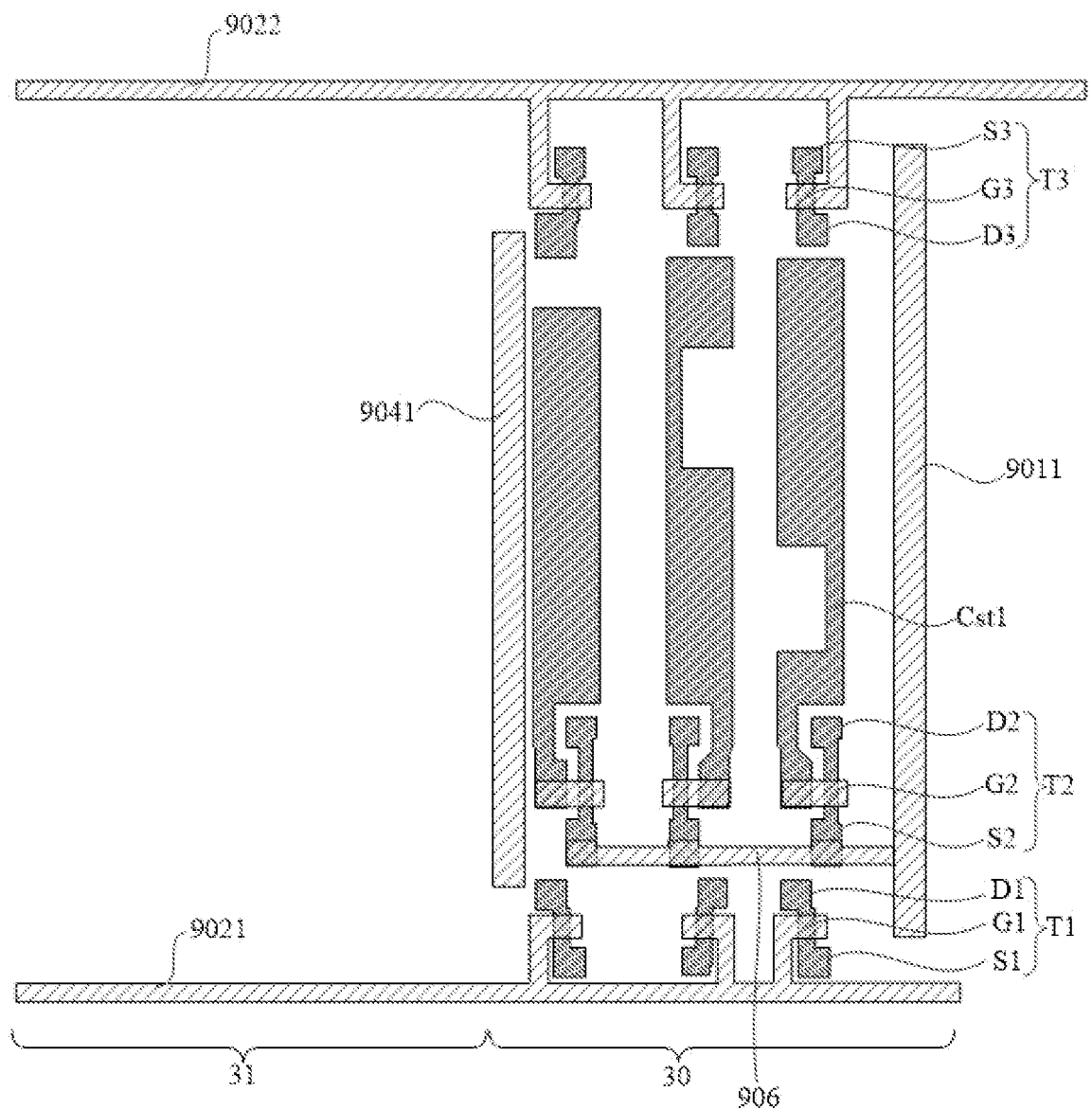
FIG. 15 is a schematic view showing the layout of an active layer and a first gate metal layer in FIG. 13.
Figure 16:
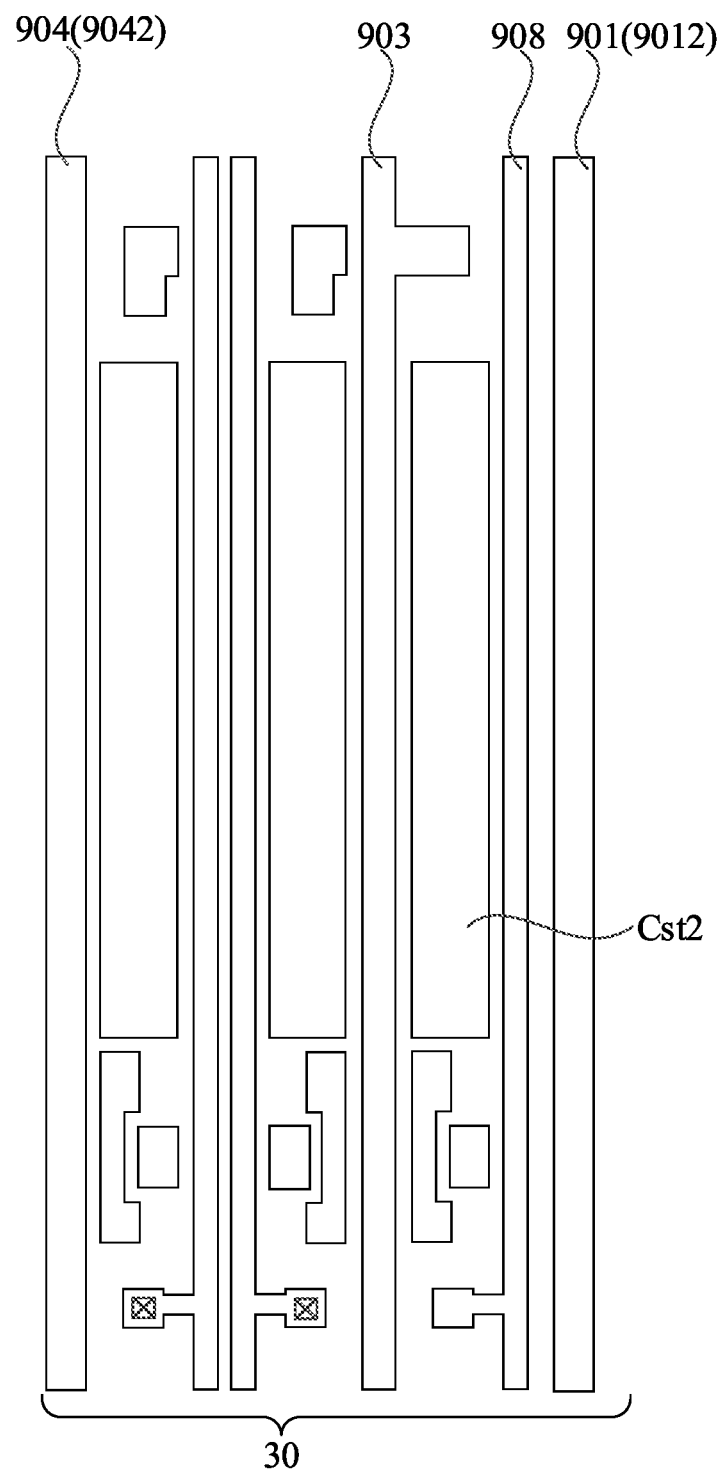
FIG. 16 is a schematic view showing the layout of a first source-drain metal layer in FIG. 13.

As shown in FIGS. 12 and 13, in some embodiments of the present disclosure, the fifth subpixel may further include a fifth subpixel driving circuitry, the fifth subpixel driving circuitry may include a fifth storage capacitor, the fifth light-emitting element 45 may include a fifth anode 8015, and an orthogonal projection of the fifth anode 8015 onto the substrate may overlap an orthogonal projection of a second electrode plate of the fifth storage capacitor onto the substrate to form an overlapping region where the fifth anode 8015 is coupled to the second electrode plate of the fifth storage capacitor through a fifth connection hole 105.

The sixth subpixel may further include a sixth subpixel driving circuitry, the sixth subpixel driving circuitry may include a sixth storage capacitor, the sixth light-emitting element 46 may include a sixth anode 8016, and an orthogonal projection of the sixth anode 8016 onto the substrate may overlap an orthogonal projection of a second electrode plate of the sixth storage capacitor onto the substrate to form an overlapping region where the sixth anode 8016 is coupled to the second electrode plate of the sixth storage capacitor through a sixth connection hole 106.

The seventh subpixel may further include a seventh subpixel driving circuitry, the seventh subpixel driving circuitry may include a seventh storage capacitor, the seventh light-emitting element 47 may include a seventh anode 8017, and an orthogonal projection of the seventh anode 8017 onto the substrate may overlap an orthogonal projection of a second electrode plate of the seventh storage capacitor onto the substrate to form an overlapping region where the seventh anode 8017 is coupled to the second electrode plate of the seventh storage capacitor through a seventh connection hole 107.

The fifth connection hole 105, the sixth connection hole 106 and the seventh connection hole 107 may be arranged in a staggered manner in the first direction.

When the fifth connection hole 105, the sixth connection hole 106 and the seventh connection hole 107 are arranged as mentioned hereinabove, the connection holes corresponding to different subpixels may be distributed evenly in one display region 30, so as to ensure the display quality of the display panel in a better manner.

In some embodiments of the present disclosure, the fifth subpixel may include a red subpixel R, the sixth subpixel may include a green subpixel G, and the seventh subpixel may include a blue subpixel B.

As shown in FIGS. 1, 5, 6 and 13, in some embodiments of the present disclosure, each display circuitry may include: a first scanning line 9021, at least a part of which extends in the first direction; a second scanning line 9022, at least a part of which extends in the first direction; a sensing signal line 903, at least a part of which extends in the second direction; and a first power source signal line 901, at least a part of which extends in the second direction. Each subpixel may further include a data line 908, at least a part of which extends in the second direction. The subpixel driving circuitry may include a first transistor T1, a second transistor T2, a third transistor T3 and a storage capacitor Cst. A gate electrode G1 of the first transistor T1 may be coupled to the first scanning line 9021, a first electrode S1 of the first transistor T1 may be coupled to the data line 908, and a second electrode D1 of the first transistor T1 may be coupled to a gate electrode G2 of the second transistor T2. A first electrode S2 of the second transistor T2 may be coupled to the first power source signal line 901, and a second electrode D2 of the second transistor T2 may be coupled to an anode 801 of a light-emitting element. A gate electrode G3 of the third transistor T3 may be coupled to the second scanning line 9022, a first electrode S3 of the third transistor T3 may be coupled to the sensing signal line 903, and a second electrode D3 of the third transistor T3 may be coupled to the anode 801 of the light-emitting element. A first electrode plate Cst1 of the storage capacitor Cst may be coupled to the gate electrode G2 of the second transistor T2, and a second electrode plate Cst2 of the storage capacitor Cst may be coupled to the second electrode D2 of the second transistor T2.

To be specific, the display circuitry may include one first scanning line 9021 and one second scanning line 9022 which are arranged in the second direction. At least a part of the first scanning line 9021 and at least a part of the second scanning line 9022 may extend in the first direction. It should be appreciated that, in the display circuitries in a same row in the first direction, the first scanning lines 9021 of the display circuitries may be coupled to each other sequentially, e.g., formed integrally. Identically, in the display circuitries in a same row in the first direction, the second scanning lines 9022 of the display circuitries may be coupled to each other sequentially, e.g., formed integrally.

The display circuitry may include one sensing signal line 903 and one first power source signal line 901, and at least a part of the sensing signal line 903 and at least a part of the first power source signal line may extend in the second direction. In the display circuitries in a same column in the second direction, the sensing signal lines 903 of the display circuitries may be coupled to each other sequentially, e.g., formed integrally. Identically, in the display circuitries in a same column in the second direction, the first power source signal lines 901 of the display circuitries may be coupled to each other sequentially, e.g., formed integrally.

Each subpixel may further include the data line 908, at least a part of which extends in the second direction. For example, in the display circuitries in a same column in the second direction, the data lines 908 of the display circuitries may be coupled to each other sequentially, e.g., formed integrally.

For example, the subpixel driving circuitry may include the first transistor T1, the second transistor T2, the third transistor T3 and the storage capacitor Cst. The gate electrode G1 of the first transistor T1 may be coupled to the first scanning line 9021 of the display circuitry where the first transistor T1 is located, the first electrode S1 of the first transistor T1 may be coupled to the data line 908 of the subpixel where the first transistor is located, and the second electrode D1 of the first transistor T1 may be coupled to the gate electrode G2 of the second transistor T2.

The first electrode S2 of the second transistor T2 may be coupled to the first power source signal line 901 of the display circuitry where the second transistor is located, and the second electrode D2 of the second transistor T2 may be coupled to the anode 801 of the light-emitting element of the subpixel where the second transistor is located.

The gate electrode G3 of the third transistor T3 may be coupled to the second scanning line 9022 of the display circuitry where the third transistor is located, the first electrode S3 of the third transistor T3 may be coupled to the sensing signal line 903 of the display circuitry where the third transistor is located, and the second electrode D3 of the third transistor T3 may be coupled to the anode 801 of the light-emitting element of the subpixel where the third transistor is located.

The storage capacitor Cst may include the first electrode plate and the second electrode plate arranged opposite to each other in a direction perpendicular to the substrate. The first electrode plate may be coupled to the gate electrode G2 of the second transistor T2, and the second electrode plate may be coupled to the second electrode D2 of the second transistor T2. For example, the first electrode plate may be formed using an active layer of the display panel, and the second electrode plate may be formed using a source-drain metal layer of the display panel.

In some embodiments of the present disclosure, the first transistor T1, the second transistor T2, the storage capacitor Cst and the third transistor T3 may be arranged sequentially in the second direction.

To be specific, the third transistor T3, the storage capacitor Cst, the second transistor T2 and the first transistor T1 may be arranged in various modes. For example, the first transistor T1, the second transistor T2, the storage capacitor Cst and the third transistor T3 may be arranged sequentially in the second direction.

More specifically, the first transistor T1 may include a first active pattern, at least a part of which extends in the second direction. The second transistor T2 may include a second active pattern, at least a part of which extends in the second direction. The third transistor T3 may include a third active pattern, at least a part of which extends in the second direction. For example, the first active pattern, the second active pattern and the third active pattern may be arranged sequentially in the second direction.

For example, the first electrode plate Cst1 and the second electrode plate of the storage capacitor Cst may extend in the second direction, and the first electrode plate may be arranged at a same layer, and made of a same material, as the first active pattern, the second active pattern and the third active pattern.

For example, the first active pattern, the second active pattern, the first electrode plate Cst1 of the storage capacitor Cst and the third active pattern may be arranged sequentially in the second direction.

In the display panel according to one embodiment of the present disclosure, the first transistor T1, the second transistor T2, the storage capacitor Cst and the third transistor T3 may be arranged sequentially in the second direction, so that the subpixel driving circuitry is of a strip-like structure extending in the second direction. Through this arrangement mode, the pixel driving circuitry setting region may be of a simple structure, so as to prevent the occurrence of the complex routing of a large quantity of metal lines as well as excessive via-holes, thereby to improve the yield of the display panel. Moreover, through the above arrangement mode, the resistance-capacitance (RC) loadings generated by the data lines 908 may be substantially the same, so it is able to prevent a display difference caused by different RC loadings generated by the data lines 908, thereby to ensure the display effect of the display panel in a better manner.

As shown in FIGS. 5, 6, 7, 13 and 14, in some embodiments of the present disclosure, each subpixel may further include a light-shielding pattern 701 arranged between the substrate and the subpixel driving circuitry and extending in the second direction, and an orthogonal projection of the subpixel driving circuitry onto the substrate may be located within an orthogonal projection of the light-shielding pattern 701 onto the substrate.

To be specific, when the subpixel further includes the light-shielding pattern 701 arranged between the substrate and the subpixel driving circuitry to shield light for the subpixel driving circuitry, it is able to ensure the operating stability of the transistors in the subpixel driving circuitry in a better manner, and ensure the display effect of the display panel.

For example, the light-shielding pattern 701 may be arranged in such a manner as to shield, but not limited to, more than 90% of the pixel driving circuitry setting region.

As shown in FIGS. 5, 6, 7, 13 and 14, in some embodiments of the present disclosure, the orthogonal projection of the light-shielding pattern 701 onto the substrate 10 may overlap an orthogonal projection of the second electrode plate Cst2 of the storage capacitor Cst onto the substrate 10 to form an overlapping region where the light-shielding pattern 701 is coupled to the second electrode plate Cst2 of the storage capacitor Cst.

To be specific, the orthogonal projection of the light-shielding pattern 701 onto the substrate may overlap the orthogonal projection of the second electrode plate Cst2 of the storage capacitor Cst onto the substrate to form a large overlapping region where the light-shielding pattern 701 is coupled to the second electrode plate Cst2 of the storage capacitor Cst through a via-hole. It should be appreciated that, a specific position of the via-hole may be set according to the practical need. For example, the via-hole may be formed at a position in proximity to a via-hole through which the subpixel driving circuitry is coupled to the anode 801 of the light-emitting element.

When the light-shielding pattern 701 is coupled to the second electrode plate Cst2 of the storage capacitor Cst, the light-shielding pattern 701 may be at a same potential as the second electrode plate, so it is able to prevent the operating stability of the subpixel driving circuitry from being adversely affected due to a floating state of the light-shielding pattern 701.

As shown in FIGS. 5, 6, 7, 13 and 14, in some embodiments of the present disclosure, each display circuitry may further include a first adapter pattern 905, at least a part of the first adapter pattern 905 may extend in the first direction, an orthogonal projection of the first adapter pattern 905 onto the substrate may overlap an orthogonal projection of the sensing signal line 903 of the display circuitry onto the substrate to form an overlapping region where the first adapter pattern 905 is coupled to the sensing signal line 903, the first adapter pattern 905 may be coupled to the first electrode S3 of each third transistor T3 in the display region 30 where the first adapter pattern is located, and the first adapter pattern 905 may be arranged at a same layer, and made of a same material, as the light-shielding pattern 701.

To be specific, the display circuitry may further include the first adapter pattern 905, at least a part of which extends in the first direction. The orthogonal projection of the first adapter pattern 905 onto the substrate may overlap the orthogonal projection of the sensing signal line 903 in the display circuitry where the first adapter pattern is located onto the substrate to form an overlapping region where the first adapter pattern is coupled to the sensing signal line 903 through a via-hole.

The orthogonal projection of the first adapter pattern 905 onto the substrate may also overlap an orthogonal projection of the first electrode S3 of each third transistor T3 in the display circuitry where the first adapter pattern is located onto the substrate to form an overlapping region where the first adapter pattern 905 is coupled to the first electrode S3 of each third transistor T3 in the display circuitry where the first adapter pattern is located through a via-hole.

The first adapter pattern 905 may be arranged at a same layer, and made of a same material, as the light-shielding pattern 701, so that the first adapter pattern 905 and the light-shielding pattern 701 may be formed through a single patterning process. In this way, it is able to simplify a manufacture process of the display panel in a better manner, and reduce the manufacture cost.

In addition, when the first adapter pattern 905 is arranged at a same layer, and made of a same material, as the light-shielding pattern 701, it is able to provide a large layout space for the first adapter pattern 905, thereby to reduce a difficulty in the layout of the first adapter pattern 905 in a better manner.

As shown in FIGS. 5, 8, 9, 13, 15 and 16, in some embodiments of the present disclosure, the first power source signal line 901 may include a first portion 9011 and a second portion 9012 laminated one on another and extending in the second direction, an orthogonal projection of the first portion 9011 onto the substrate may overlap an orthogonal projection of the second portion 9012 onto the substrate to form an overlapping region where the first portion 9011 is coupled to the second portion 9012 through a via-hole, the first portion 9011 may be arranged at a same layer, and made of a same material, as the first scanning line 9021, and the second portion 9012 may be arranged at a same layer, and made of a same material, as the data line 908.

To be specific, the first power source signal line 901 may be of various structures. For example, the first power source signal line 901 may include the first portion 9011 and the second portion 9012 laminated one on another and extending in the second direction. In the display circuitries in a same column in the second direction, the second portions 9012 of the first power source signal lines 901 may be coupled sequentially to each other, e.g., formed integrally.

For example, the orthogonal projection of the first portion 9011 onto the substrate may overlap the orthogonal projection of the second portion 9012 onto the substrate to form an overlapping region where the first portion 9011 is coupled to the second portion 9012 through a plurality of via-holes arranged sequentially in the second direction.

It should be appreciated that, the first power source signal line 901 may be a positive power source signal line for transmitting a positive power source signal.

When the first power source signal line 901 includes the first portion 9011 and the second portion 9012 laminated one on another, it is able to reduce the RC loading generated by the first power source signal line 901 in a better manner, thereby to improve the display quality of the display panel.

In addition, when the first portion 9011 is arranged at a same layer, and made of a same material, as the first scanning line 9021 and the second portion 9012 is arranged at a same layer, and made of a same material, as the data line 908, it is able to form the first portion 9011 and the first scanning line 9021 through a single patterning process and form the second portion 9012 and the data line 908 through a single patterning process, thereby to simplify the manufacture process of the display panel in a better manner and reduce the manufacture cost of the display panel.

As shown in FIGS. 5, 8, 13 and 15, in some embodiments of the present disclosure, each display circuitry may further include a second adapter pattern 906, at least a part of the second adapter pattern 906 may extend in the first direction, the second adapter pattern 906 and the first portion 9011 may be formed integrally, and the second adapter pattern 906 may be coupled to the first electrode S2 of each second transistor T2 in the display region 30 where the second adapter pattern is located.

To be specific, the display circuitry may further include the second adapter pattern 906, at least a part of which extends in the first direction. An orthogonal projection of the second adapter pattern 906 onto the substrate may overlap the orthogonal projection of the first electrode S2 of each second transistor T2 in the display circuitry to which the second adapter pattern belongs onto the substrate to form an overlapping region where the second adapter pattern is coupled to the first electrode S2 of each second transistor T2 through a via-hole.

When the second adapter pattern 906 is formed integrally with the first portion 9011, the first electrode S2 of each second transistor T2 may be coupled to the first power source signal line 901 through the second adapter pattern 906, so as to receive a power source signal from the first power source signal line 901.

When the second adapter pattern 906 is formed integrally with the first portion 9011, the second adapter pattern 906 and the first portion 9011 may be formed through a single patterning process, so it is able to simplify the manufacture process of the display panel in a better manner, and reduce the manufacture cost of the display panel.

As shown in FIGS. 5, 8, 9, 13, 15 and 16, in some embodiments of the present disclosure, each display circuitry may further include a second power source signal line 904, the second power source signal line 904 may include a third portion 9041 and a fourth portion 9042 laminated one on another and extending in the second direction, an orthogonal projection of the third portion 9041 onto the substrate may overlap an orthogonal projection of the fourth portion 9042 onto the substrate to form an overlapping region where the third portion 9041 is coupled to the fourth portion 9042 through a via-hole, the third portion 9041 may be arranged at a same layer, and made of a same material, as the first scanning line 9021, and the fourth portion 9042 may be arranged at a same layer, and made of a same material, as the data line 908. The light-emitting element may further include a cathode arranged at a side of the anode 801 away from the substrate and coupled to the second power source signal line 904.

To be specific, the second power source signal line 904 may be of various structures. For example, the second power source signal line 904 may include the third portion 9041 and the fourth portion 9042 laminated one on another and extending in the second direction. In the display circuitries in a same column in the second direction, the fourth portions 9042 of the second power source signal lines 904 may be coupled sequentially to each other, e.g., formed integrally.

For example, the orthogonal projection of the third portion 9041 onto the substrate may overlap the orthogonal projection of the fourth portion 9042 onto the substrate to form an overlapping region where the third portion 9041 is coupled to the fourth portion 9042 through a plurality of via-holes arranged sequentially in the second direction.

It should be appreciated that, the second power source signal line 904 may be a negative power source signal line for transmitting a negative power source signal.

The light-emitting element may further include a cathode layer 73 arranged at a side of the anode 801 away from the substrate. For example, the cathode layer 73 may be arranged at a side of the light-emitting functional layer away from the substrate, and the cathode may be coupled to the second power source signal line 904.

When the second power source signal line 904 includes the third portion 9041 and the fourth portion 9042 laminated one on another, it is able to reduce the RC loading generated by the second power source signal line 904 in a better manner, thereby to improve the display quality of the display panel.

In addition, when the third portion 9041 is arranged at a same layer, and made of a same material, as the first scanning line 9021 and the fourth portion 9042 is arranged at a same layer, and made of a same material, as the data line 908, the third portion 9041 and the first scanning line 9021 may be formed through a single patterning process and the fourth portion 9042 and the data line 908 may be formed through a single patterning process. In this way, it is able to simplify the manufacture process of the display panel in a better manner, and reduce the manufacture cost of the display panel.

In some embodiments of the present disclosure, an overlapping area between the orthogonal projections of the light-emitting elements of the plurality of subpixels in one display circuitry onto the substrate and an orthogonal projection of the display region 30 of the display circuitry onto the substrate may be greater than 90% of an area of the display region 30.

To be specific, when the light-emitting element includes the anode 801, the first light-emitting functional layer and the color filter pattern, the overlapping area between the orthogonal projections of the anodes 801 of the light-emitting elements of the plurality of subpixels in one display circuitry onto the substrate and the orthogonal projection of the display region 30 of the display circuitry onto the substrate may be greater than 90% of the area of the display region 30, or the overlapping area between orthogonal projections of color filter patterns of the light-emitting elements of the plurality of subpixels in one display circuitry onto the substrate and the orthogonal projection of the display region 30 of the display circuitry onto the substrate may be greater than 90% of the area of the display region 30.

When the light-emitting element includes the anode 801 and the second light-emitting functional layer, the overlapping area between the orthogonal projections of the anodes 801 of the light-emitting elements of the plurality of subpixels in one display circuitry onto the substrate and the orthogonal projection of the display region 30 of the display circuitry onto the substrate may be greater than 90% of the area of the display region 30, or the overlapping area between orthogonal projections of second light-emitting functional layers of the light-emitting elements of the plurality of subpixels in one display circuitry onto the substrate and the orthogonal projection of the display region 30 of the display circuitry onto the substrate may be greater than 90% of the area of the display region 30.

It should be appreciated that, during the layout of the light-emitting elements, the anodes 801 of different light-emitting elements need to be spaced apart from each other by a certain gap, so as to prevent the occurrence of a short circuit between the anodes 801.

Through the above arrangement mode, it is able for the light-emitting element in each display circuitry to utilize the layout space to the greatest extent, thereby to improve the display quality of the display panel.

The present disclosure further provides in some embodiments a display device including the above-mentioned display panel.

In the display panel according to the embodiments of the present disclosure, the display region 30 may include the plurality of pixel driving circuitry setting regions arranged sequentially in the first direction, and each pixel driving circuitry setting region may extend in the second direction. Each display circuitry may include the plurality of subpixels in one-to-one correspondence with the pixel driving circuitry setting regions, and the subpixel driving circuitry in each subpixel may be located in the corresponding pixel driving circuitry setting region. The width of the light-emitting element in each subpixel may be greater than the width of the corresponding pixel driving circuitry setting region in the first direction, and the length of the light-emitting element may be smaller than the length of the corresponding pixel driving circuitry setting region in the second direction. Through the above arrangement mode, the orthogonal projection of the light-emitting element onto the substrate may overlap the orthogonal projections of at least two pixel driving circuitry setting regions onto the substrate. At this time, even when the width of the pixel driving circuitry setting region in the first direction decreases and thereby it is of the elongated structure extending in the second direction along with an increase in the resolution of the display panel, the light-emitting element may be still provided with an appropriate length-to-width ratio. As a result, it is able to prevent a difficulty in the manufacture of the light-emitting element from being increased, prevent the occurrence of cross color for the display panel, and ensure the good display effect of the display panel. Hence, according to the embodiments of the present disclosure, in the case of not increasing the manufacture difficulty, it is able for the display panel to achieve transparent display at high quality and high resolution in a better manner.

Hence, when the display device includes the above-mentioned display panel, it may also have the same beneficial effect, which will not be particularly defined herein.

It should be appreciated that, the display device may be any product or member having a display function, e.g., a television, a display, a digital photo frame, a mobile phone or a tablet computer.

The present disclosure further provides in some embodiments a method for manufacturing the above-mentioned display panel, which includes forming a plurality of display circuitries on a substrate. Each display circuitry includes a display region 30 and a transparent region 31, the display region 30 includes a plurality of pixel driving circuitry setting regions arranged sequentially in a first direction, and each pixel driving circuitry setting region extends in a second direction intersecting the first direction. Each display circuitry includes a plurality of subpixels in one-to-one correspondence with the pixel driving circuitry setting regions, each subpixel includes a subpixel driving circuitry and a light-emitting element coupled to each other, the subpixel driving circuitry is located in a corresponding pixel driving circuitry setting region, the light-emitting element is located at a side of the subpixel driving circuitry away from the substrate, a width of the light-emitting element is greater than a width of the corresponding pixel driving circuitry setting region in the first direction, and a length of the light-emitting element is smaller than a length of the corresponding pixel driving circuitry setting region in the second direction.

In the display panel manufactured using the above-mentioned method according to the embodiments of the present disclosure, the display region 30 may include the plurality of pixel driving circuitry setting regions arranged sequentially in the first direction, and each pixel driving circuitry setting region 300 may extend in the second direction. Each display circuitry may include the plurality of subpixels in one-to-one correspondence with the pixel driving circuitry setting regions, and the subpixel driving circuitry in each subpixel may be located in the corresponding pixel driving circuitry setting region. The width of the light-emitting element in each subpixel may be greater than the width of the corresponding pixel driving circuitry setting region in the first direction, and the length of the light-emitting element may be smaller than the length of the corresponding pixel driving circuitry setting region in the second direction. Through the above arrangement mode, the orthogonal projection of the light-emitting element onto the substrate may overlap the orthogonal projections of at least two pixel driving circuitry setting regions onto the substrate. At this time, even when the width of the pixel driving circuitry setting region in the first direction decreases and thereby it is of the elongated structure extending in the second direction along with an increase in the resolution of the display panel, the light-emitting element may be still provided with an appropriate length-to-width ratio. As a result, it is able to prevent a difficulty in the manufacture of the light-emitting element from being increased, prevent the occurrence of cross color for the display panel, and ensure the good display effect of the display panel. Hence, according the display panel manufacturing using the method in the embodiments of the present disclosure, in the case of not increasing the manufacture difficulty, it is able for the display panel to achieve transparent display at high quality and high resolution in a better manner.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a substrate, and a plurality of display circuitries arranged on the substrate, wherein each display circuitry comprises a display region and a transparent region, the display region comprises a plurality of pixel driving circuitry setting regions arranged sequentially in a first direction, and each pixel driving circuitry setting region extends in a second direction intersecting the first direction; and each display circuitry comprises a plurality of subpixels in one-to-one correspondence with the pixel driving circuitry setting regions, each subpixel comprises a subpixel driving circuitry and a light-emitting element coupled to each other, the subpixel driving circuitry is located in a corresponding pixel driving circuitry setting region, the light-emitting element is located at a side of the subpixel driving circuitry away from the substrate, a width of the light-emitting element is greater than a width of the corresponding pixel driving circuitry setting region in the first direction, and a length of the light-emitting element is smaller than a length of the corresponding pixel driving circuitry setting region in the second direction;

wherein each display circuitry comprises: a first scanning line, at least a part of which extends in the first direction; a second scanning line, at least a part of which extends in the first direction; a sensing signal line, at least a part of which extends in the second direction; and a first power source signal line, at least a part of which extends in the second direction; each subpixel further comprises a data line, at least a part of which extends in the second direction;

the subpixel driving circuitry comprises a first transistor, a second transistor, a third transistor and a storage capacitor;

a gate electrode of the first transistor is coupled to the first scanning line, a first electrode of the first transistor is coupled to the data line, and a second electrode of the first transistor is coupled to a gate electrode of the second transistor;

a first electrode of the second transistor is coupled to the first power source signal line, and a second electrode of the second transistor is coupled to an anode of a light-emitting element;

a gate electrode of the third transistor is coupled to the second scanning line, a first electrode of the third transistor is coupled to the sensing signal line, and a second electrode of the third transistor is coupled to the anode of the light-emitting element; and a first electrode plate of the storage capacitor is coupled to the gate electrode of the second transistor, and a second electrode plate of the storage capacitor is coupled to the second electrode of the second transistor.

2. The display panel according to claim 1, wherein the light-emitting element comprises an anode, a first light-emitting functional layer and a color filter pattern laminated one on another in a direction away from the substrate, and the anode is coupled to a corresponding subpixel driving circuitry, wherein a width of the anode is greater than the width of the corresponding pixel driving circuitry setting region in the first direction, a length of the anode is smaller than the length of the corresponding pixel driving circuitry setting region in the second direction, a width of the color filter pattern is greater than the width of the corresponding pixel driving circuitry setting region in the first direction, and a length of the color filter pattern is smaller than the length of the corresponding pixel driving circuitry setting region in the second direction; or wherein the light-emitting element comprises an anode and a second light-emitting functional layer laminated one on another sequentially in a direction away from the substrate, and the anode is coupled to a corresponding subpixel driving circuitry, wherein a width of the anode is greater than the width of the corresponding pixel driving circuitry setting region in the first direction, a length of the anode is smaller than the length of the corresponding pixel driving circuitry setting region in the second direction, a width of the second light-emitting functional layer is greater than the width of the corresponding pixel driving circuitry setting region in the first direction, and a length of the second light-emitting functional layer is smaller than the length of the corresponding pixel driving circuitry setting region in the second direction.

3. The display panel according to claim 1, wherein light-emitting elements of the plurality of subpixels in each display circuitry are arranged in an array form, an orthogonal projection of the light-emitting element of each subpixel onto the substrate overlaps orthogonal projections of at least two adjacent pixel driving circuitry setting regions in the display region where the subpixel is located onto the substrate, and the at least two adjacent pixel driving circuitry setting regions comprise a pixel driving circuitry setting region corresponding to the subpixel.

4. The display panel according to claim 3, wherein the display region comprises a first pixel driving circuitry setting region, a second pixel driving circuitry setting region, a third pixel driving circuitry setting region and a fourth pixel driving circuitry setting region arranged sequentially in the first direction, each display circuitry comprises a first subpixel, a second subpixel, a third subpixel and a fourth subpixel, the first subpixel comprises a first light-emitting element, the second subpixel comprises a second light-emitting element, the third subpixel comprises a third light-emitting element, and the fourth subpixel comprises a fourth light-emitting element;

the first light-emitting element and the second light-emitting element are arranged in the second direction, an orthogonal projection of the first light-emitting element onto the substrate overlaps an orthogonal projection of the first pixel driving circuitry setting region onto the substrate and an orthogonal projection of the second pixel driving circuitry setting region onto the substrate, and an orthogonal projection of the second light-emitting element onto the substrate overlaps the orthogonal projection of the first pixel driving circuitry setting region onto the substrate and the orthogonal projection of the second pixel driving circuitry setting region onto the substrate; and the third light-emitting element and the fourth light-emitting element are arranged in the second direction, an orthogonal projection of the third light-emitting element onto the substrate overlaps an orthogonal projection of the third pixel driving circuitry setting region onto the substrate and an orthogonal projection of the fourth pixel driving circuitry setting region onto the substrate, and an orthogonal projection of the fourth light-emitting element onto the substrate overlaps the orthogonal projection of the third pixel driving circuitry setting region onto the substrate and the orthogonal projection of the fourth pixel driving circuitry setting region onto the substrate.

5. The display panel according to claim 4, wherein the first subpixel further comprises a first subpixel driving circuitry, the first subpixel driving circuitry comprises a first storage capacitor, the first light-emitting element comprises a first anode, and an orthogonal projection of the first anode onto the substrate overlaps an orthogonal projection of a second electrode plate of the first storage capacitor onto the substrate to form an overlapping region where the first anode is coupled to the second electrode plate of the first storage capacitor through a first connection hole;

the second subpixel further comprises a second subpixel driving circuitry, the second subpixel driving circuitry comprises a second storage capacitor, the second light-emitting element comprises a second anode, and an orthogonal projection of the second anode onto the substrate overlaps an orthogonal projection of a second electrode plate of the second storage capacitor onto the substrate to form an overlapping region where the second anode is coupled to the second electrode plate of the second storage capacitor through a second connection hole;

the third subpixel further comprises a third subpixel driving circuitry, the third subpixel driving circuitry comprises a third storage capacitor, the third light-emitting element comprises a third anode, and an orthogonal projection of the third anode onto the substrate overlaps an orthogonal projection of a second electrode plate of the third storage capacitor onto the substrate to form an overlapping region where the third anode is coupled to the second electrode plate of the third storage capacitor through a third connection hole;

the fourth subpixel further comprises a fourth subpixel driving circuitry, the fourth subpixel driving circuitry comprises a fourth storage capacitor, the fourth light-emitting element comprises a fourth anode, and an orthogonal projection of the fourth anode onto the substrate overlaps an orthogonal projection of a second electrode plate of the fourth storage capacitor onto the substrate to form an overlapping region where the fourth anode is coupled to the second electrode plate of the fourth storage capacitor through a fourth connection hole; and the first connection hole and the fourth connection hole are arranged in the first direction, and the second connection hole and the third connection hole are arranged in the first direction.

6. The display panel according to claim 4, wherein the first subpixel comprises a blue subpixel, the second subpixel comprises a white subpixel, the third subpixel comprises a green subpixel and the fourth subpixel comprises a red subpixel.

7. The display panel according to claim 1, wherein light-emitting elements of the plurality of subpixels in each display circuitry are arranged sequentially in the second direction, and an orthogonal projection of the light-emitting element of each subpixel onto the substrate overlaps orthogonal projections of the pixel driving circuitry setting regions in the display region where the subpixel is located onto the substrate.

8. The display panel according to claim 7, wherein the display region comprises a fifth pixel driving circuitry setting region, a sixth pixel driving circuitry setting region and a seventh pixel driving circuitry setting region arranged sequentially in the first direction, each display circuitry comprises a fifth subpixel, a sixth subpixel and a seventh subpixel, the fifth subpixel comprises a fifth light-emitting element, the sixth subpixel comprises a sixth light-emitting element, the seventh subpixel comprises a seventh light-emitting element, and the fifth light-emitting element, the sixth light-emitting element and the seventh light-emitting element are arranged sequentially in the second direction;

an orthogonal projection of the fifth light-emitting element onto the substrate overlaps an orthogonal projection of the fifth pixel driving circuitry setting region onto the substrate, an orthogonal projection of the sixth pixel driving circuitry setting region onto the substrate, and an orthogonal projection of the seventh pixel driving circuitry setting region onto the substrate;

an orthogonal projection of the sixth light-emitting element onto the substrate overlaps the orthogonal projection of the fifth pixel driving circuitry setting region onto the substrate, the orthogonal projection of the sixth pixel driving circuitry setting region onto the substrate, and the orthogonal projection of the seventh pixel driving circuitry setting region onto the substrate; and an orthogonal projection of the seventh light-emitting element onto the substrate overlaps the orthogonal projection of the fifth pixel driving circuitry setting region onto the substrate, the orthogonal projection of the sixth pixel driving circuitry setting region onto the substrate, and the orthogonal projection of the seventh pixel driving circuitry setting region onto the substrate.

9. The display panel according to claim 8, wherein the fifth subpixel further comprises a fifth subpixel driving circuitry, the fifth subpixel driving circuitry comprises a fifth storage capacitor, the fifth light-emitting element comprises a fifth anode, and an orthogonal projection of the fifth anode onto the substrate overlaps an orthogonal projection of a second electrode plate of the fifth storage capacitor onto the substrate to form an overlapping region where the fifth anode is coupled to the second electrode plate of the fifth storage capacitor through a fifth connection hole;

the sixth subpixel further comprises a sixth subpixel driving circuitry, the sixth subpixel driving circuitry comprises a sixth storage capacitor, the sixth light-emitting element comprises a sixth anode, and an orthogonal projection of the sixth anode onto the substrate overlaps an orthogonal projection of a second electrode plate of the sixth storage capacitor onto the substrate to form an overlapping region where the sixth anode is coupled to the second electrode plate of the sixth storage capacitor through a sixth connection hole;

the seventh subpixel further comprises a seventh subpixel driving circuitry, the seventh subpixel driving circuitry comprises a seventh storage capacitor, the seventh light-emitting element comprises a seventh anode, and an orthogonal projection of the seventh anode onto the substrate overlaps an orthogonal projection of a second electrode plate of the seventh storage capacitor onto the substrate to form an overlapping region where the seventh anode is coupled to the second electrode plate of the seventh storage capacitor through a seventh connection hole; and the fifth connection hole, the sixth connection hole and the seventh connection hole are arranged in a staggered manner in the first direction; wherein the fifth subpixel comprises a red subpixel, the sixth subpixel comprises a green subpixel, and the seventh subpixel comprises a blue subpixel.

10. The display panel according to claim 1, wherein the first transistor, the second transistor, the storage capacitor and the third transistor are arranged sequentially in the second direction.

11. The display panel according to claim 1, wherein each subpixel further comprises a light-shielding pattern arranged between the substrate and the subpixel driving circuitry and extending in the second direction, and an orthogonal projection of the subpixel driving circuitry onto the substrate is located within an orthogonal projection of the light-shielding pattern onto the substrate.

12. The display panel according to claim 11, wherein the orthogonal projection of the light-shielding pattern onto the substrate overlaps an orthogonal projection of the second electrode plate of the storage capacitor onto the substrate to form an overlapping region where the light-shielding pattern is coupled to the second electrode plate of the storage capacitor.

13. The display panel according to claim 11, wherein each display circuitry further comprises a first adapter pattern, at least a part of the first adapter pattern extends in the first direction, an orthogonal projection of the first adapter pattern onto the substrate overlaps an orthogonal projection of the sensing signal line of the display circuitry onto the substrate to form an overlapping region where the first adapter pattern is coupled to the sensing signal line, the first adapter pattern is coupled to the first electrode of each third transistor in the display region where the first adapter pattern is located, and the first adapter pattern is arranged at a same layer, and made of a same material, as the light-shielding pattern.

14. The display panel according to claim 1, wherein the first power source signal line comprises a first portion and a second portion laminated one on another and extending in the second direction, an orthogonal projection of the first portion onto the substrate overlaps an orthogonal projection of the second portion onto the substrate to form an overlapping region where the first portion is coupled to the second portion through a via-hole, the first portion is arranged at a same layer, and made of a same material, as the first scanning line, and the second portion is arranged at a same layer, and made of a same material, as the data line.

15. The display panel according to claim 14, wherein each display circuitry further comprises a second adapter pattern, at least a part of the second adapter pattern extends in the first direction, the second adapter pattern and the first portion are formed integrally, and the second adapter pattern is coupled to the first electrode of each second transistor in the display region where the second adapter pattern is located.

16. The display panel according to claim 1, wherein each display circuitry further comprises a second power source signal line, the second power source signal line comprises a third portion and a fourth portion laminated one on another and extending in the second direction, an orthogonal projection of the third portion onto the substrate overlaps an orthogonal projection of the fourth portion onto the substrate to form an overlapping region where the third portion is coupled to the fourth portion through a via-hole, the third portion is arranged at a same layer, and made of a same material, as the first scanning line, and the fourth portion is arranged at a same layer, and made of a same material, as the data line, wherein the light-emitting element further comprises a cathode arranged at a side of the anode away from the substrate and coupled to the second power source signal line.

17. The display panel according to claim 1, wherein an overlapping area between the orthogonal projections of the light-emitting elements of the plurality of subpixels in one display circuitry onto the substrate and an orthogonal projection of the display region of the display circuitry onto the substrate is greater than 90% of an area of the display region.

18. A display device, comprising the display panel according to claim 1.

19. A method for manufacturing a display panel, comprising forming a plurality of display circuitries on a substrate, wherein each display circuitry comprises a display region and a transparent region, the display region comprises a plurality of pixel driving circuitry setting regions arranged sequentially in a first direction, and each pixel driving circuitry setting region extends in a second direction intersecting the first direction, wherein each display circuitry comprises a plurality of subpixels in one-to-one correspondence with the pixel driving circuitry setting regions, each subpixel comprises a subpixel driving circuitry and a light-emitting element coupled to each other, the subpixel driving circuitry is located in a corresponding pixel driving circuitry setting region, the light-emitting element is located at a side of the subpixel driving circuitry away from the substrate, a width of the light-emitting element is greater than a width of the corresponding pixel driving circuitry setting region in the first direction, and a length of the light-emitting element is smaller than a length of the corresponding pixel driving circuitry setting region in the second direction;

wherein each display circuitry comprises: a first scanning line, at least a part of which extends in the first direction; a second scanning line, at least a part of which extends in the first direction; a sensing signal line, at least a part of which extends in the second direction; and a first power source signal line, at least a part of which extends in the second direction; each subpixel further comprises a data line, at least a part of which extends in the second direction;

the subpixel driving circuitry comprises a first transistor, a second transistor, a third transistor and a storage capacitor;

a gate electrode of the first transistor is coupled to the first scanning line, a first electrode of the first transistor is coupled to the data line, and a second electrode of the first transistor is coupled to a gate electrode of the second transistor;

a first electrode of the second transistor is coupled to the first power source signal line, and a second electrode of the second transistor is coupled to an anode of a light-emitting element;

a gate electrode of the third transistor is coupled to the second scanning line, a first electrode of the third transistor is coupled to the sensing signal line, and a second electrode of the third transistor is coupled to the anode of the light-emitting element; and a first electrode plate of the storage capacitor is coupled to the gate electrode of the second transistor, and a second electrode plate of the storage capacitor is coupled to the second electrode of the second transistor.

* * * * *